United States Patent
Yano et al.

(10) Patent No.: US 6,963,166 B2
(45) Date of Patent: Nov. 8, 2005

(54) LED LAMP

(75) Inventors: Tadashi Yano, Kyoto (JP); Masanori Shimizu, Kyotanabe (JP); Nobuyuki Matsui, Takatsuki (JP); Tatsumi Setomoto, Takatsuki (JP); Tetsushi Tamura, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 10 days.

(21) Appl. No.: 10/704,005

(22) Filed: Nov. 7, 2003

(65) Prior Publication Data

US 2004/0100192 A1 May 27, 2004

(30) Foreign Application Priority Data

Nov. 7, 2002 (JP) .......................... 2002-324313

(51) Int. Cl.[7] .................................. H01J 1/62
(52) U.S. Cl. .................. 313/498; 313/502; 313/506
(58) Field of Search ................... 313/498, 501, 313/502, 506, 509, 512, 113, 114; 445/23, 66

(56) References Cited

U.S. PATENT DOCUMENTS 3,875,456 A  4/1975  Kano et al.
5,847,507 A  12/1998  Butterworth et al.
6,417,019 B1  7/2002  Mueller et al.
2003/0189829 A1  10/2003  Shimizu et al.

FOREIGN PATENT DOCUMENTS

| DE | 22 60 285 A | | 6/1973 | |
|---|---|---|---|---|
| JP | 05-290818 A | | 11/1993 | |
| JP | 10-065221 A | | 3/1998 | |
| JP | 2000022220 A | * | 1/2000 | .......... H01L/33/00 |
| JP | 2001-358370 A | | 12/2001 | |
| WO | WO 01/82385 A1 | | 11/2001 | |

* cited by examiner

*Primary Examiner*—Vip Patel
(74) *Attorney, Agent, or Firm*—Akin Gump Strauss Hauer & Feld, LLP

(57) ABSTRACT

An LED lamp includes a substrate, an LED chip, and a resin portion. The LED chip is flip-chip bonded to the substrate. The resin portion covers the LED chip and includes at least one type of phosphor that transforms the emission of the LED chip into light having a longer wavelength than the emission. In this LED lamp, the resin portion has at least one side surface. The side surface is separated from another surface that can reflect the outgoing light of the resin portion, surrounds the side surfaces of the LED chip and is curved at least partially.

28 Claims, 17 Drawing Sheets

LED LAMP

BACKGROUND OF THE INVENTION

1. Field of the Invention

The present invention relates to an LED lamp including an LED chip, which is covered with a resin portion containing a phosphor, and also relates to a method for fabricating such an LED lamp.

2. Description of the Related Art

White LED lamps are recently under vigorous research and development as potential replacements for white incandescent lamps. In some of those white LED lamps, the package of a blue LED chip, made of gallium nitride (GaN), is coated with a phosphor such as YAG. In such an LED lamp, the blue LED chip produces an emission with a wavelength of about 450 nm, and the phosphor produces yellow fluorescence with a peak wavelength of about 550 nm on receiving that emission. Eventually, the emission and fluorescence mix with each other, thereby providing white light.

In another type of white LED lamp currently under development, an LED chip that emits an ultraviolet ray is combined with a phosphor that produces red (R), green (G) and blue (B) light rays. In such an LED lamp, the ultraviolet ray that has been radiated from the LED chip excites the phosphor, thereby emitting the red, green and blue light rays. Consequently, white light can also be obtained as a mixture of these light rays.

A bullet-shaped package is extensively used in conventional LED lamps. Hereinafter, such an LED lamp with a bullet-shaped appearance will be described with reference to FIG. 1.

FIG. 1 illustrates a cross-sectional structure for a conventional LED lamp 20 as disclosed in Japanese Patent No. 2998696, for example. As shown in FIG. 1, the LED lamp 20 includes an LED chip 21, a bullet-shaped transparent housing to cover the LED chip 21, and leads 22a and 22b to supply current to the LED chip 21. A cup reflector 23 for reflecting the emission of the LED chip 21 in the direction indicated by the arrow D is provided for the mount portion of the lead 22b. The inner walls (i.e., reflective surfaces) of the cup reflector 23 surround the side surfaces of the LED chip 21 so as to define a predetermined tilt angle with respect to the bottom of the cup reflector 23. The LED chip 21 on the mount portion is encapsulated with a first resin portion 24, which is further encapsulated with a second resin portion 25.

The first resin portion 24 is obtained by filling the cup reflector 23 with a resin material and curing it after the LED chip 21 has been mounted onto the bottom of the cup reflector 23 and then has had its cathode and anode electrodes electrically connected to the leads 22a and 22b by way of wires. A phosphor 26 is dispersed in the first resin portion 24 so as to be excited with the light A that has been emitted from the LED chip 21. The excited phosphor 26 produces fluorescence (which will be referred to herein as "light B") that has a longer wavelength than the light A. This LED lamp 20 is designed such that if the light A radiated from the LED chip 21 is red, then the light B emitted from the phosphor 26 is yellow. A portion of the light A is transmitted through the first resin portion 24 including the phosphor 26. As a result, light C as a mixture of the light A and light B is used as illumination.

The conventional LED lamp shown in FIG. 1, however, has a color unevenness problem.

In this LED lamp, the light C, obtained by mixing the light A and light B together, is used as illumination as described above. Accordingly, color unevenness is easily created in the light C depending on the shape of the first resin portion 24 including the phosphor 26.

In the conventional LED lamp 20, the first resin portion 24 is obtained by filling the cup reflector 23 with a resin material and curing it such that the LED chip 21 is encapsulated with the resin material. Thus, the shape of the first resin portion 24 is defined by that of the internal recess of the cup reflector 23. In the LED lamp 20 shown in FIG. 1, the reflective surfaces of the cup reflector 23 are tilted so as to define a downwardly tapered cross section. Accordingly, the upper surface of the resultant first resin portion 24 is broader than the lower surface thereof, and the side surfaces thereof make tight contact with the reflective surfaces of the cup reflector 23. That is to say, the cup reflector 23 is closely filled with the first resin portion 24 so as to create no gaps between the first resin portion 24 and the cup reflector 23.

Specifically, the first resin portion 24 is obtained by pouring a resin liquid into the cup and curing it. For that reason, the upper surface of the first resin portion 24 often becomes uneven as shown in FIG. 1. In addition, since the resin portion 24 has a downwardly tapered cross section, the upper surface of the resin portion 24 has a relatively broad area, thus creating significant effects. That is to say, such unevenness on the upper surface of the first resin portion 24 makes the thickness of the resin layer including the phosphor uneven. In that case, the amount of the phosphor included in one part of the resin portion 24 will be significantly different from that of the phosphor included in another part of the resin portion 24. In other words, the amount of the phosphor included changes according to the optical path of the light A being transmitted through the resin portion 24. As a result, quite noticeable color unevenness is created in the light C.

Furthermore, since the first resin portion 24 makes close contact with the reflective surfaces of the cup reflector 23, the part of the first resin portion 24 surrounding the side surfaces of the LED chip 21 has non-uniform, variable thicknesses. In that case, the light that has gone out of the LED chip 21 through a side surface thereof is absorbed into the phosphor in the first resin portion 24 in variable amounts while being transmitted through the first resin portion 24 and before reflected from the reflective surfaces. The amount of the light absorbed into the phosphor also changes with the optical path thereof because the thicknesses of that part of the resin portion 24 are non-uniform. FIG. 2 schematically shows the optical paths E and F of the light that has been radiated through a side surface of the LED chip 21. As can be seen from FIG. 2, when taking the optical path E, the light A needs to go a relatively short distance through the first resin portion 24. On the other hand, when taking the optical path F, the light A needs to go a relatively long distance through the first resin portion 24. The light A radiated from the LED chip 21 is absorbed into the phosphor while exciting the phosphor and making the phosphor radiate the light B. Accordingly, if the light A radiated from the LED chip 21 should go different distances through the first resin portion 24, then the mixture ratio of the light A and light B is changeable with the optical path. As a result, significant color unevenness is created in the light C for use as illumination. The optical path length is often variable if the side surfaces of the first resin portion 24 are tapered to reflect the internal shape of the cup reflector 23 as shown in FIG. 2.

SUMMARY OF THE INVENTION

In order to overcome the problems described above, preferred embodiments of the present invention provide an LED lamp with reduced color unevenness.

An LED lamp according to a preferred embodiment of the present invention preferably includes a substrate, an LED chip, and a resin portion. The LED chip is preferably flip-chip bonded to the substrate. The resin portion preferably covers the LED chip and preferably includes at least one type of phosphor that transforms the emission of the LED chip into light having a longer wavelength than the emission. In this LED lamp, the resin portion preferably has at least one side surface. The side surface is preferably separated from another surface that is able to reflect the outgoing light of the resin portion, preferably surrounds the side surfaces of the LED chip and is preferably curved at least partially.

In one preferred embodiment of the present invention, the LED chip preferably has at least three planar side surfaces, each adjacent pair of which is preferably joined together by a corner portion.

In this particular preferred embodiment, at least part of the side surface of the resin portion, which faces the corner portion of the LED chip, is preferably curved.

More specifically, an angle defined by the curved part of the resin portion with respect to the center of the resin portion is preferably greater than the largest possible angle of rotation of the LED chip being mounted onto the substrate. The angle of rotation is preferably defined with respect to the center of the LED chip.

In another preferred embodiment, the resin portion preferably has an axisymmetric shape.

In a specific preferred embodiment, the resin portion preferably has the shape of a cylinder, of which the diameter is longer than the diagonals of the LED chip.

In that case, the LED lamp is preferably designed so as to satisfy $0.02$ mm$\leq h \leq 0.1$ mm and $0.15$ mm$\leq x \leq 0.5$ mm, where h is the distance between the upper surface of the resin portion including the phosphor and that of the LED chip and x is the distance between the side surface of the resin portion including the phosphor and those of the LED chip.

In another preferred embodiment, the phosphor is preferably a non-YAG-based substance, and if h exceeds 0.1 mm, then the LED lamp preferably satisfies $0.47 \leq h/x \leq 1.82$, where h is the distance between the upper surface of the resin portion including the phosphor and that of the LED chip and x is the distance between the side surface of the resin portion including the phosphor and those of the LED chip.

In still another preferred embodiment, the resin portion including the phosphor is preferably made of a silicone resin. The phosphor preferably has a mean particle size of 3 $\mu$m to 15 $\mu$m and a greater specific gravity than the silicone resin. The LED lamp preferably satisfies $0.2 \leq h/x \leq 0.5$, where h is the distance between the upper surface of the resin portion including the phosphor and that of the LED chip and x is the distance between the side surface of the resin portion including the phosphor and those of the LED chip.

In this particular preferred embodiment, the resin portion including the phosphor preferably includes particles of a thixo agent, of which the mean particle size is less than 1 $\mu$m.

In yet another preferred embodiment, not only the LED chip but also at least one more LED chip are preferably bonded to the substrate, and each of the LED chips is preferably covered with the resin portion separately.

In that case, the LED lamp preferably further includes a reflective member with reflective surfaces that are sloped so as to reflect the outgoing light of the resin portions of the LED chips away from the substrate. The reflective surfaces are preferably sloped so as to surround the respective LED chips.

More particularly, the reflective member is preferably a plate having multiple openings, each of which surrounds an associated one of the LED chips, and is preferably provided on the substrate. The reflective member is preferably at most twenty times as thick as the resin portion.

In a specific preferred embodiment, the reflective member preferably has a thickness of at most 5 mm.

In yet another preferred embodiment, not only the LED chip but also at least one more LED chip are preferably bonded to the substrate, and all of the LED chips are preferably covered with the single resin portion.

In yet another preferred embodiment, the LED lamp preferably further includes a reflective member with a reflective surface that is sloped so as to reflect the outgoing light of the resin portion away from the substrate.

In this particular preferred embodiment, the reflective member is preferably a plate provided on the substrate, and the reflective surface is preferably defined by the inner wall of an opening of the plate so as to surround the side surface of the resin portion including the phosphor.

In yet another preferred embodiment, the LED lamp preferably further includes a second resin portion that covers the resin portion(s).

In yet another preferred embodiment, the LED lamp preferably further includes a second resin portion that fills a gap between the side surface of the resin portion including the phosphor and the reflective member.

In a specific preferred embodiment, the second resin portion preferably functions as a lens.

In yet another preferred embodiment, the center axis of the resin portion including the phosphor preferably substantially corresponds with that of the LED chip.

A method for fabricating an LED lamp according to a preferred embodiment of the present invention preferably includes the steps of (a) preparing a substrate on which at least one LED chip has been flip-chip bonded and (b) providing a resin portion on the substrate. The resin portion preferably covers the LED chip and preferably includes a phosphor that transforms the emission of the LED chip into light having a longer wavelength than the emission. In this method, the step (b) preferably includes the step of molding a resin material such that the resin portion has an exposed side surface.

The step (b) may include the steps of: (b1) molding the resin material with a member that defines the shape of the side surface of the resin portion, thereby forming the resin portion; and (b2) removing the member from the side surface of the resin portion.

In one preferred embodiment of the present invention, the step (a) may include the step of preparing a substrate on which multiple LED chips have been flip-chip bonded. In that case, the step (b) preferably includes the step of covering each of the LED chips with the resin portion separately.

In this particular preferred embodiment, the step (b) preferably includes the step of forming the resin portion in a cylindrical shape.

In another preferred embodiment, the method may further include the step (c) of arranging a reflective member, having a reflective surface for reflecting the outgoing light of the resin portion, on the substrate after the step (b) has been performed.

In this particular preferred embodiment, the step (a) may include the step of preparing a substrate on which multiple LED chips have been flip-chip bonded. In that case, the step (c) preferably includes the step of arranging a reflective member, having a plurality of reflective surfaces surrounding the LED chips, on the substrate.

In a specific preferred embodiment, the method preferably further includes the step (d) of stacking a second resin portion on the resin portion including the phosphor after the step (c) has been performed.

In that case, the step (d) preferably includes the step of forming the second resin portion in a lens shape.

In an LED lamp according to a preferred embodiment of the present invention, the side surface of a resin portion, including a phosphor, is separated from another surface that is able to reflect the outgoing light of the resin portion, and surrounds the side surfaces of an LED chip. Accordingly, any light ray being transmitted through the resin portion after having gone out of the LED chip through a side surface thereof needs to go substantially the same distance, which hardly changes with the direction of the light ray. As a result, the color unevenness can be reduced significantly. Particularly when the resin portion is formed in a cylindrical shape, the color unevenness can be reduced even more effectively. In that case, even if the LED chips being mounted face various directions, the color unevenness still hardly changes with the direction.

Other features, elements, processes, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
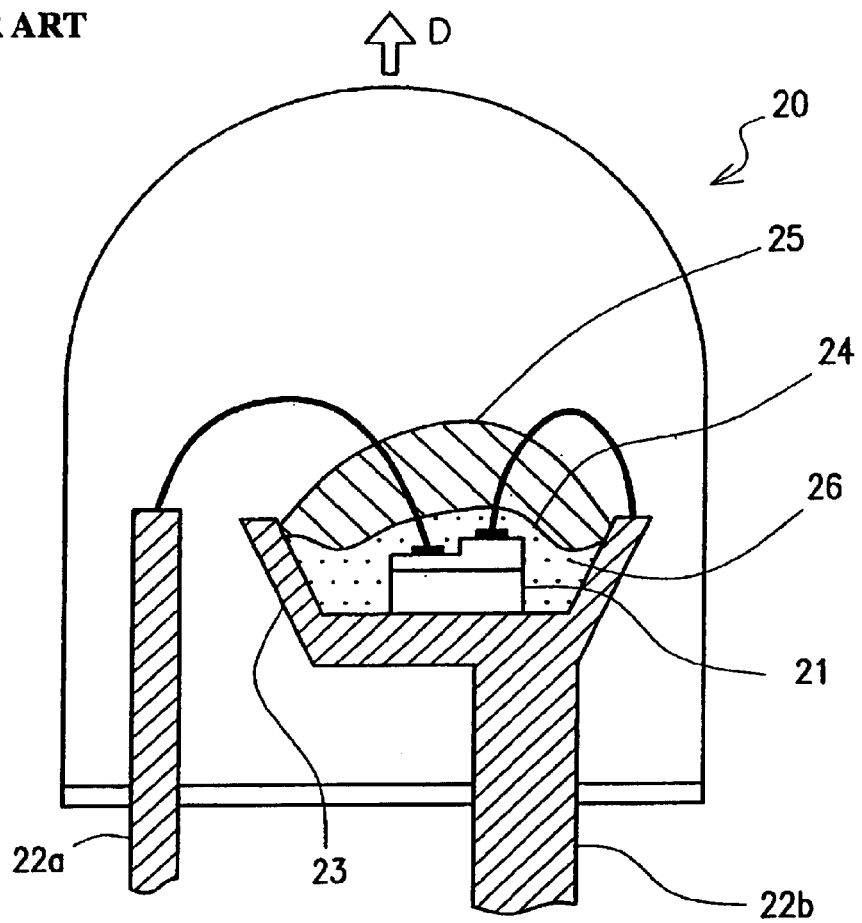
FIG. 1 is a cross-sectional view illustrating a conventional LED lamp.

Hereinafter, preferred embodiments of the present invention will be described with reference to the accompanying drawings. In the drawings, a number of different members, appearing on multiple sheets but having substantially the same functions, are collectively identified by the same reference numeral for the sake of simplicity.

Embodiment 1

Figure 3A:
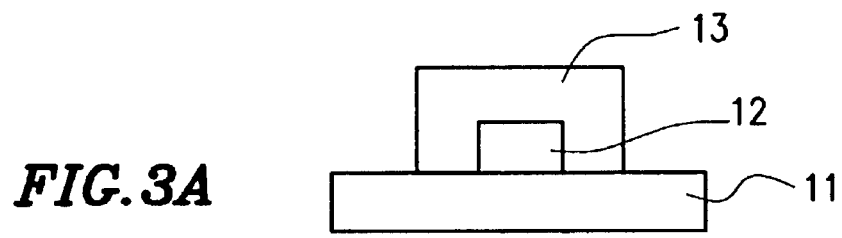
FIGS. 3A and 3B are respectively a cross-sectional view and a plan view schematically illustrating an LED lamp according to a first specific preferred embodiment of the present invention.
Figure 3B:
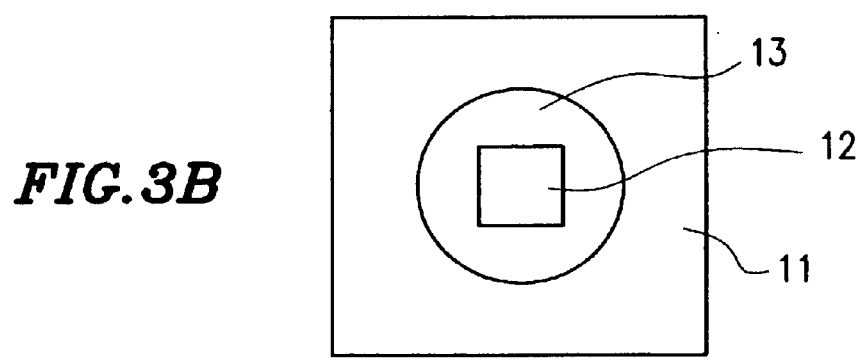

First, referring to FIGS. 3A and 3B, illustrated is an LED lamp according to a first specific preferred embodiment of the present invention. As shown in FIGS. 3A and 3B, the LED lamp preferably includes a substrate 11, an LED chip 12 bonded to the substrate 11, and a resin portion 13 including a phosphor (or luminophore). In this preferred embodiment, the LED chip 12 is preferably flip-chip bonded to the principal surface of the substrate 11. Although not shown in FIG. 3A or 3B, interconnects are actually provided on the substrate 11 and electrically connected to the electrodes of the LED chip 12 mounted. The LED chip 12 is preferably supplied with a predetermined current or voltage from a lighting circuit (not shown) and through the interconnects on the substrate 11 to make the LED chip 12 emit the light.

The phosphor dispersed in the resin portion 13 absorbs, and is excited by, the emission of the LED chip 12, thereby producing fluorescence. The light produced from the phosphor preferably has a longer wavelength than the emission of the LED chip 12. For example, when a blue LED chip is used as the LED chip 12, $(Y.Sm)_3$, $(Al.Ga)_5O_{12}$:Ce or $(Y_{0.39}Gd_{0.57}Ce_{0.03}Sm_{0.01})_3Al_5O_{12}$ can be used effectively as the phosphor. By using such a phosphor, part of the blue ray emitted from the LED chip 12 can be transformed into a yellow ray and the resultant illumination looks almost white overall.

Not just the phosphor but also particles of a thixo agent, of which the mean particle size is smaller than 1 $\mu$m, are preferably added to the resin portion 13. Examples of the thixo agents include fine particles of silica, titania, alumina, and/or magnesium oxide. These fine particles have a mean particle size of several nanometers, which is smaller than that of the phosphor by approximately two orders of magnitude. The thixo agent contributes to maintaining the shape of the resin portion 13.

In this preferred embodiment, the resin portion 13 preferably has a side surface, which is separated from another surface (not shown) that can reflect the outgoing light of the resin portion 13. More specifically, the resin portion 13 is preferably formed in a cylindrical shape so as to have a diameter longer than the diagonals of the LED chip 12 and be higher than the LED chip 12. As shown in FIGS. 3A and 3B, the side surface of the resin portion 13 is preferably a curved surface that surrounds the side surfaces of the LED chip 12. As used herein, the "surface that can reflect the outgoing light of the resin portion 13" is typically a reflective surface of a reflective member that is provided specially for the purpose of reflection but may also be a surface of any other member.

In this manner, the side surface of the resin portion 13 of this preferred embodiment is not defined by the reflective surface of a reflective member, for example, but may be a freely designed curved surface. Thus, the color unevenness can be reduced effectively.

Hereinafter, a method of forming the cylindrical resin portion 13 will be described with reference to FIG. 4.

First, a substrate 41 on which an LED chip 44 has been mounted is preferably prepared. In this preferred embodiment, the LED chip 44 is preferably flip-chip bonded to the principal surface of the substrate 41. Next, a plate 42 with a cylindrical hole (opening) is brought into close contact with the principal surface of the substrate 41. Thereafter, a resin liquid including the phosphor is poured into the cylindrical hole. The plate 42 preferably has a thickness of 0.02 mm to 1.1 mm. The diameter of the hole is preferably longer (e.g., about 0.8 mm) than the diagonals (of 0.3 mm to 1.0 mm, for example) of the LED chip 44.

After the resin liquid has been poured into the hole of the plate 42, the excessive part of the resin liquid over the upper surface of the plate 42 is flattened with a squeeze 43 and then the resin liquid is thermally set. Thereafter, the plate 42 is removed from over the substrate 41, thereby obtaining a cylindrical resin portion that entirely covers the LED chip 44.

Figure 4:
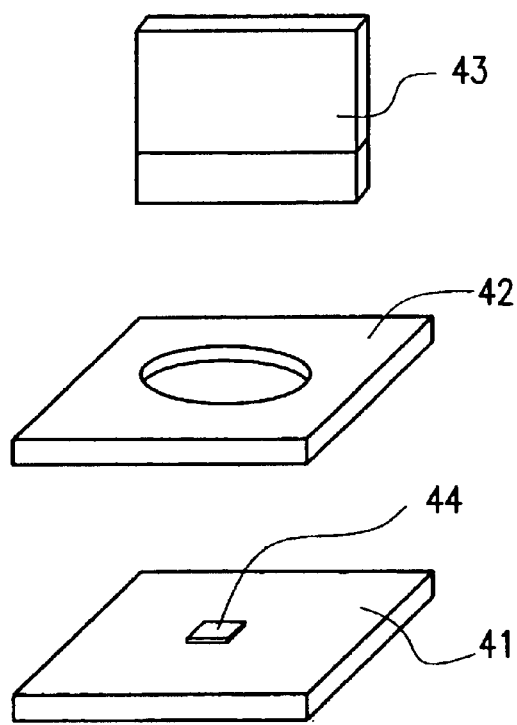
FIG. 4 is a perspective view showing an exemplary method of forming the resin portion shown in FIG. 3.

In the example illustrated in FIG. 4, just one LED chip 44 is mounted on the substrate 41 and just one hole is provided through the plate 42. However, if multiple LED chips 44 are mounted on the substrate 41, a plurality of cylindrical resin portions can be formed at the same time by using a plate that has multiple holes for the respective LED chips 44.

According to the method shown in FIG. 4, the resin portion that encapsulates the LED chip 44 can be molded before a reflective member (or reflector) is attached onto the substrate 41. Thus, the shape of the resin portion can be freely determined without being limited by the shape of the reflective surface of the reflective member. More specifically, the hole shape of the plate 42 defines the side surface shape of the resin portion. Accordingly, by controlling the shape of this hole, the resin portion can be formed in any other shape, not just cylindrical. For example, if a triangular prism or rectangular parallelepiped hole is provided through the plate 42, the resin portion can also be formed in a shape corresponding with that of the hole.

It should be noted that a "cross-sectional shape of a resin portion" is taken herein on a plane that is defined perpendicularly to a normal to the principal surface of the substrate. According to this definition, the cylindrical resin portion has a "circular" cross-sectional shape. In this preferred embodiment, however, the cross-sectional shape of the resin portion does not have to be "completely round" in a strict sense. If the cross-sectional shape of the resin portion is a polygon with a relatively small number of vertices such as a triangle or a rectangle, then some problems occur as will be described later. In contrast, if the cross-sectional shape is a polygon with six or more vertices, then the polygon is sufficiently axisymmetric and can be regarded as substantially "circular". This is why the "cylindrical resin portion" may also have a polygonal cross-sectional shape with six or more vertices.

Also, examples of "resins" include herein thermoplastic resins, thermosetting resins, resins that cure upon the exposure to a radiation such as an ultraviolet ray, inorganic polymers, and glasses. Optionally, the resin may further include an additive such as a photostabilizer.

In the preferred embodiment described above, the side surface of the resin portion is curved entirely. However, the effects of the present invention are also achievable even if the side surface is curved just partially. This point will be described with reference to FIGS. 19A and 19B.

Figure 19A:
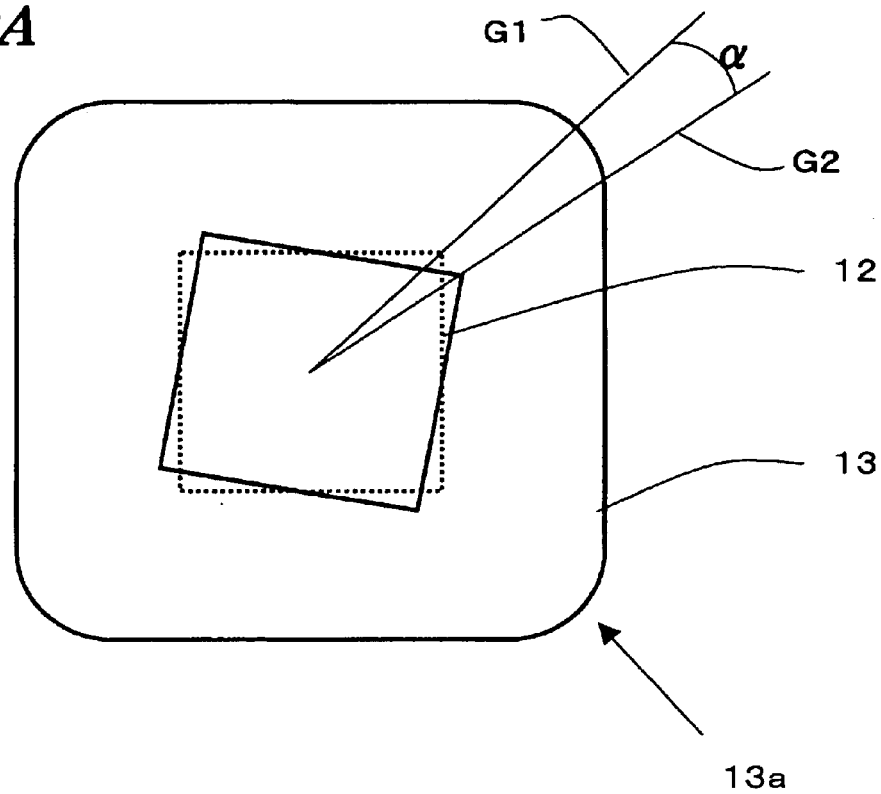
FIG. 19A is a plan view schematically illustrating a resin portion in an LED lamp according to a preferred embodiment of the present invention.

FIG. 19A is a plan view illustrating an exemplary layout of the resin portion 13 and the LED chip 12 surrounded with the resin portion 13. In FIG. 19A, the LED chip 12 that has not rotated from the originally intended position is indicated by the dotted square, while the LED chip 12 that has rotated and shifted from the original position is indicated by the solid square. The angle of shift caused by the rotation is supposed herein to be at most equal to $\alpha$ degrees. The resin portion 13 shown in FIG. 19A has four curved corners 13a. The largest possible angle defined by any of these four curved corners 13a with respect to the center of the resin portion 13 is supposed herein to be equal to $2\times\alpha$ degrees. In that case, as can be seen from FIG. 19A, if the angle of shift caused by the rotation is smaller than α degrees, then the extended diagonals on the upper surface of the LED chip 12 always cross the curved portions 13a of the side surface of the resin portion 13, not the flat portions thereof. For example, one of the two diagonals of the LED chip 12 that has not shifted at all from its original position is identified by G1, while the associated diagonal of the LED chip 12 that has rotated α degrees from its original position is identified by G2. Take a look at the light rays that have gone out of the LED chip 12 through a side surface thereof and along the diagonals G1 and G2. As shown in FIG. 19A, the distance that the outgoing light ray of the LED chip 12 at the original position should go along the diagonal G1 to reach the side surface of the resin portion 13 is not significantly different from the distance that the outgoing light ray of the LED chip 12 at the shifted position should go along the diagonal G2 to reach the side surface of the resin portion 13. This is because the side surface of the resin portion 13 has the curved corners 13a at the positions shown in FIG. 19A.

Figure 19B:
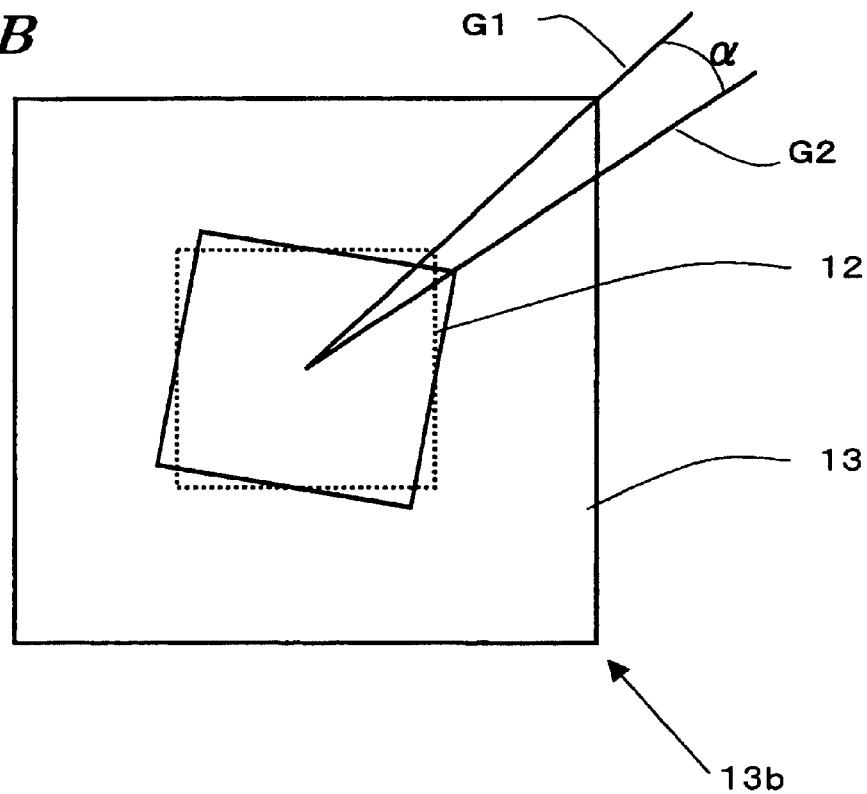
FIG. 19B is a plan view schematically illustrating a resin portion in an LED lamp of a comparative example.

In contrast, the resin portion 13 shown in FIG. 19B has no curved corners. Accordingly, the distance that the outgoing light ray of the LED chip 12 at the original position should go along the diagonal G1 to reach the side surface of the resin portion 13 is significantly different from the distance that the outgoing light ray of the LED chip 12 at the shifted position should go along the diagonal G2 to reach the side surface of the resin portion 13. When these distances are significantly different from each other, color unevenness is easily caused as a result of the rotation of the LED chip 12.

As can be understood easily from the foregoing description, not the entire side surface of the resin portion 13 has to be a curved surface that surrounds the side surfaces of the LED chip. That is to say, the curved surfaces of the resin portion need to be present so as to face at least the corners of the LED chip. More specifically, the angle (=2α) defined by any of the curved surfaces 13a of the resin portion 13 with respect to the center of the resin portion 13 is at least greater than the largest possible angle of rotation of the LED chip 12 being mounted onto the substrate.

When the side surface of the resin portion has such curved surfaces, the thickness of the resin portion as measured laterally (i.e., parallel to the principal surface of the substrate) is not uniform. If a thin phosphor layer is applied or deposited on the surfaces of the LED chip, then the phosphor layer will have a substantially uniform thickness on the surfaces of the LED chip. Thus, the resin portion for use in preferred embodiments of the present invention has a unique shape, which is quite different from that of the phosphor layer.

Figure 24A:
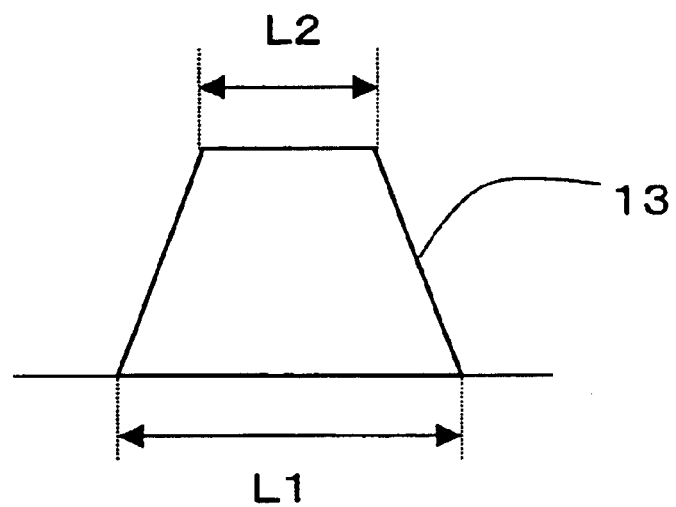
FIGS. 24A and 24B are respectively a cross-sectional view and plan view schematically illustrating a tapered first resin portion.
Figure 24B:
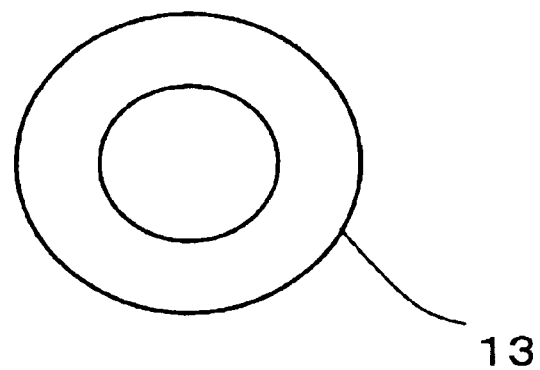

Next, a cross-sectional shape of the resin portion 13 taken on a plane that crosses the substrate 11 at right angles will be described. The right and left sides of this cross section do not have to be perpendicular to the substrate 11. Instead, according to the method shown in FIG. 4, the resin portion 13 may also be formed as to have slightly tapered sides. FIGS. 24A and 24B show a cross-sectional shape and a planar shape of such a tapered resin portion, respectively. In FIG. 24A, the ratio of the top diameter L2 to the bottom diameter L1 (which will be referred to herein as the "L2/L1 ratio") is preferably at least 0.5. This is because the inner walls of the hole of the plate preferably stand substantially perpendicularly to the principal surface of the substrate in order to pour the resin liquid into the hole with no gaps left. Also, if the top diameter L2 is too small, then the color unevenness caused by the shift of the LED chip will have serious effects. Thus, the L2/L1 ratio is preferably as close to one as possible.

In the method of forming the resin portion described above, the upper surface of the resin portion is smoothed out with the squeeze 43. Thus, the upper surface of the resin portion does not become excessively uneven but substantially flat. While the resin liquid is being cured, the upper surface of the resin portion may lose its planarity to a certain degree but never becomes rugged enough to cause perceivable color unevenness. In addition, since the resin portion is cylindrical, the upper surface of the resin portion has a relatively small area. Accordingly, even if the upper surface of the resin portion has lost much of its planarity, almost no color unevenness will be noticeable in that case. It should be noted that the cylindrical resin portion for use in various preferred embodiments of the present invention cannot be formed by the conventional method in which the resin liquid is poured into, and then cured in, the cup reflector.

Hereinafter, other methods of forming the resin portion will be described with reference to FIGS. 5A through 5C.

Figure 5A:
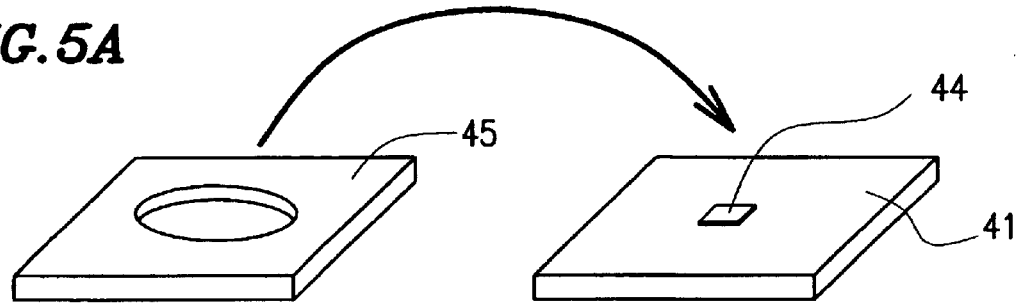
FIGS. 5A, 5B and 5C are perspective views showing other methods of forming the resin portion shown in FIG. 3.

First, referring to FIG. 5A, a mold 45 that defines the shape of the resin portion 13 is preferably prepared and filled with the resin liquid according to an alternative method. Thereafter, the resin liquid is somewhat cured with a heat source or an additive that increases its viscosity. Then, the mold 45 including the half-cured resin portion is placed on the substrate 41, thereby transferring the resin portion onto the substrate 41. Finally, the mold 45 is removed from over the substrate 41 and the resin portion that has been transferred onto the substrate 41 is further cured.

Figure 5B:
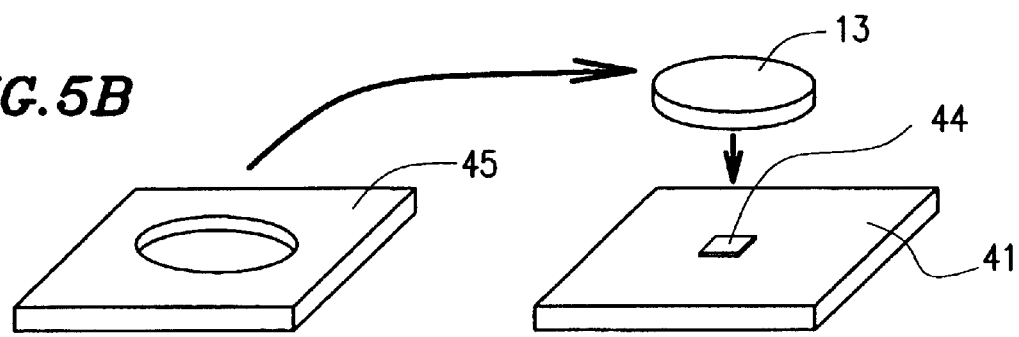

According to another alternative method shown in FIG. 5B, the half-cured resin portion 13 may be picked out of the mold 45, pressed against the LED chip 44 that has been mounted on the substrate 41, and then further cured.

Figure 5C:
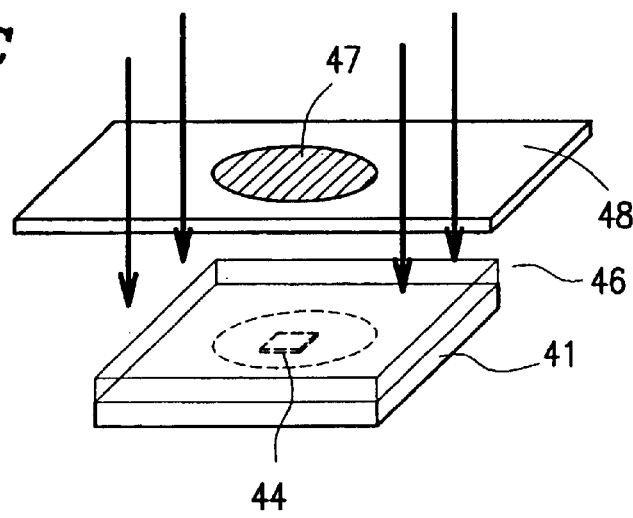

Optionally, a method that uses no mold 45 may also be adopted as shown in FIG. 5C. Specifically, in the example illustrated in FIG. 5C, first, the surface of the substrate 41 on which the LED chip 44 has been mounted is coated with a photosensitive resin layer 46. The photosensitive resin layer 46 may be obtained by applying a photoresist, including a phosphor, onto the substrate 41, for example. Next, only a selected area of the photosensitive resin layer 46 is exposed to radiation and developed through a photomask 48 that has an opaque pattern 47 defining the planar shape of the resin portion, thereby forming the resin portion. It should be noted that the photosensitive resin layer 46 may be made of either a negative photoresist or a positive photoresist as long as the opaque pattern 47 of the photomask 48 has an appropriately selected shape.

As described above, in this preferred embodiment, the LED chip is fixed onto the substrate by a flip-chip bonding technique. Such a flip-chip bonding process may be carried out in the following manner. First, the LED chip is sucked with a collet or any other suitable instrument and arranged at an appropriate location on the substrate. Thereafter, the LED chip is preferably bonded onto the substrate by ultrasonic flip-chip bonding or any of various other techniques. In the ultrasonic flip-chip bonding technique, the LED chip is subjected to ultrasonic vibrations while the metal electrodes on the LED chip are pressed against the metal electrodes on the substrate, thereby welding and bonding the two groups of metal electrodes together. The ultrasonic flip-chip bonding can be used effectively to mount and arrange a plurality of LED chips at a high density, because this technique needs no solder for connection and can be carried out at a relatively low temperature. According to the ultrasonic flip-chip bonding process, however, the LED chips easily rotate under the ultrasonic vibrations and face various directions before welded and bonded to the substrate completely.

Accordingly, if the resin portion including the phosphor has a square cross-sectional shape, then the distance that the outgoing light ray of the LED chip should go to pass through the resin portion changes significantly with the direction thereof. As a result, the degree of color unevenness perceived changes depending on the direction that the LED chip faces relative to the resin portion.

Hereinafter, it will be described with reference to FIGS. 6A through 6C and FIGS. 7A through 7C how the spatial distribution of luminous intensity of the LED chip is affected by the cross-sectional shape of the resin portion.

Figure 6A:
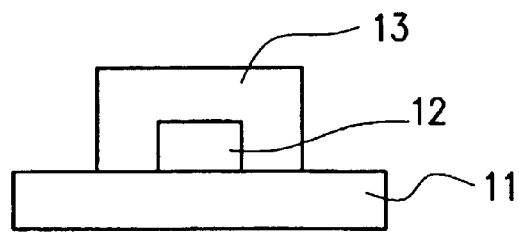
FIGS. 6A and 6B are respectively a cross-sectional view and a plan view schematically illustrating a main portion of the LED lamp of the first preferred embodiment.
Figure 6B:
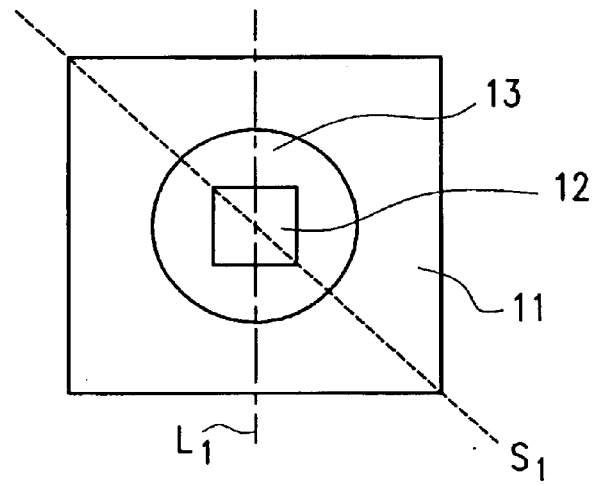
Figure 7A:
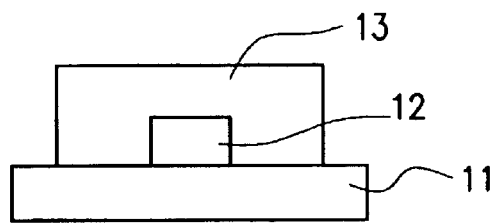
FIGS. 7A and 7B are respectively a cross-sectional view and a plan view schematically illustrating a main portion of an LED lamp of a comparative example.
Figure 7B:
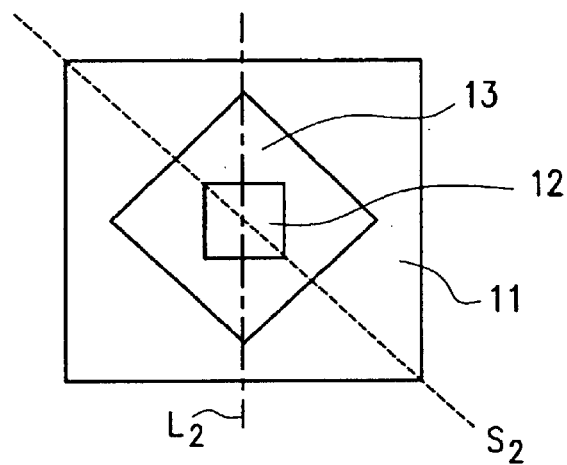

FIGS. 6A and 6B are respectively a cross-sectional view and a plan view schematically illustrating a main portion of the LED lamp of the first preferred embodiment. On the other hand, FIGS. 7A and 7B are respectively a cross-sectional view and a plan view schematically illustrating a main portion of an LED lamp of a comparative example, of which the resin portion including the phosphor is formed in a quadrangular prism shape.

Figure 6C:
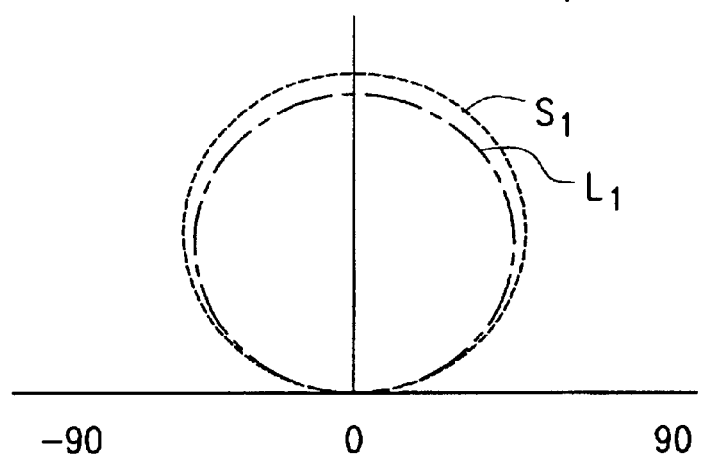
FIG. 6C is a diagram showing the spatial distribution of luminous intensity of the LED lamp of the first preferred embodiment.
Figure 7C:
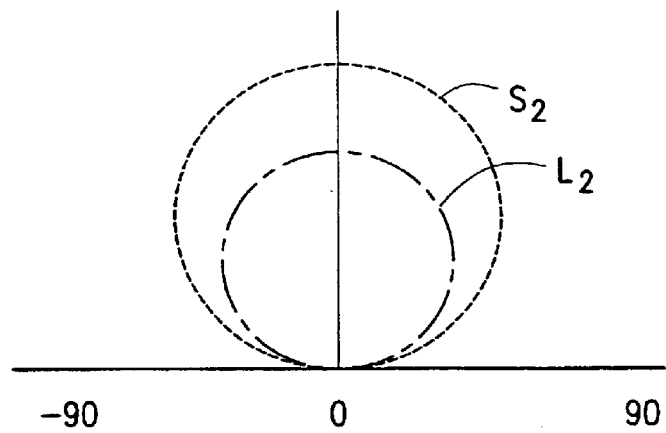
FIG. 7C is a diagram showing the spatial distribution of luminous intensity of the LED lamp of the comparative example.

In FIG. 6B, two planes L1 and S1 are defined perpendicularly to the principal surface of the substrate 11. In the same way, two planes L2 and S2 are also defined perpendicularly to the principal surface of the substrate 11. FIG. 6C shows the spatial distribution of luminous intensity on the L1 and S1 planes, which are also identified by the common reference signs L1 and S1, respectively. Likewise, FIG. 7C shows the spatial distribution of luminous intensity on the L2 and S2 planes, which are also identified by the common reference signs L2 and S2, respectively. In this case, the spatial distribution of luminous intensity is obtained by calculating the luminous intensities for a −90 degree to 90 degree range, which is defined with respect to a normal to the principal surface of the substrate, through computer simulations. That is to say, this 180 degree range is defined with the normal regarded as representing the 0 degree direction.

As can be seen from FIG. 6C, if the resin portion 13 has a circular cross section, almost the same spatial distribution of luminous intensities are obtained on the L1 and S1 planes. In contrast, if the resin portion 13 has a rectangular cross section, then the spatial distribution of luminous intensity on the L2 plane will be significantly different from that on the S2 plane as can be seen from FIG. 7C.

Thus, when the resin portion 13 has a square cross section, the spatial distribution of luminous intensity is changeable with the direction, and the resultant color unevenness is quite perceivable. In that case, the color unevenness cannot be reduced unless the direction of the LED chip 12 with respect to the resin portion 13 is controlled appropriately. However, according to the ultrasonic flip-chip bonding technique, the direction of the LED chip 12 is non-controllable as described above.

In contrast, if the resin portion 13 has a circular cross section as in the preferred embodiment described above, then the direction dependence of the spatial distribution of luminous intensity can be reduced significantly and the direction-dependent color unevenness problem can be resolved. It should be noted that this particular effect of the present invention is also achievable to a certain extent even if the resin portion 13 does not have a circular cross section but an elliptical cross section, for example. Even so, however, the center axis of the resin portion including the phosphor preferably substantially corresponds with that of the LED chip.

Embodiment 2

Figure 8A:
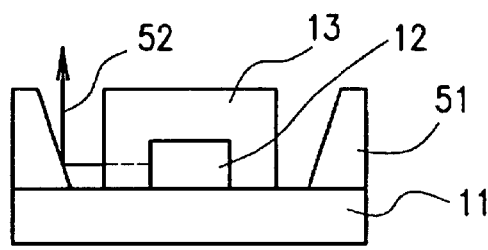
FIGS. 8A and 8B are respectively a cross-sectional view and a plan view schematically illustrating an LED lamp according to a second specific preferred embodiment of the present invention.
Figure 8B:
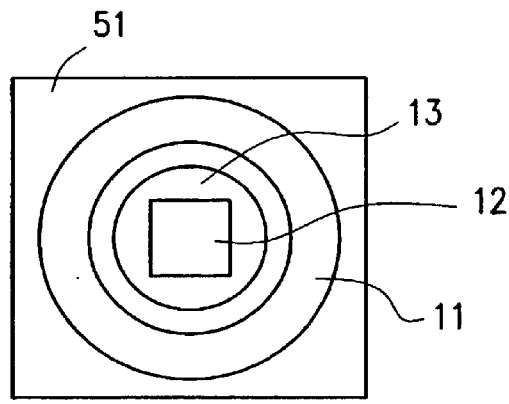

Hereinafter, an LED lamp according to a second specific preferred embodiment of the present invention will be described with reference to FIGS. 8A and 8B. FIGS. 8A and 8B are respectively a cross-sectional view and a plan view schematically illustrating the LED lamp of the second preferred embodiment.

The LED lamp of the second preferred embodiment preferably includes a substrate 11, an LED chip 12 that has been bonded to the substrate 11, a resin portion 13 including a phosphor, and a reflector 51 that has been attached to the substrate 11. All of these members of the LED lamp, except the reflector 51, are the same as the counterparts of the first preferred embodiment described above, and the description thereof will be omitted herein.

As shown in FIG. 8A, the reflector 51 preferably has a downwardly tapered reflective surface, which is axisymmetric with respect to the center of the LED chip 12. This reflective surface is preferably the side surface of an opening of the metallic reflector 51. The shortest diameter of this opening (i.e., as measured closest to the substrate, or at the bottom of the opening) is longer than the diameter of the cylindrical resin portion 13. Accordingly, the reflector 51 may also have a parabolic shape.

The reflective surface of the reflector 51 receives a light ray 52, which has been emitted from the LED chip 12 through a side surface thereof, and reflects the light ray 52 substantially perpendicularly to the principal surface of the substrate 11 as shown in FIG. 8A. Thus, the optical output of this LED lamp as measured perpendicularly to the principal surface of the substrate is higher than that of the LED lamp including no reflector 51.

Figure 2:
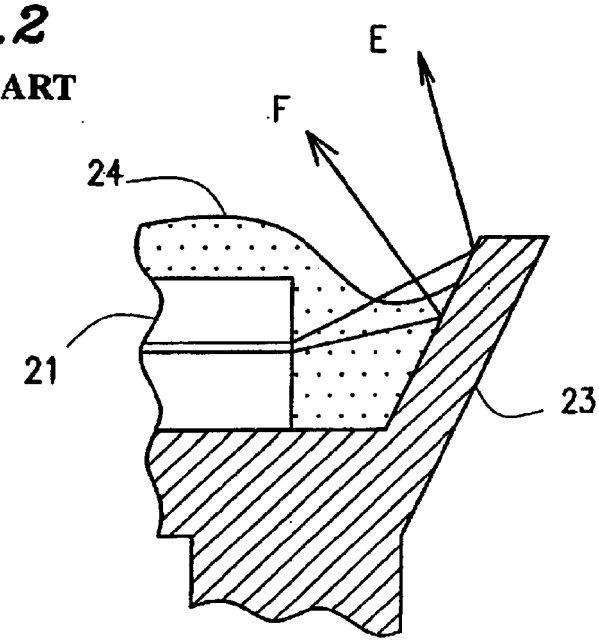
FIG. 2 is a cross-sectional view illustrating a portion of the LED lamp shown in FIG. 1 on a larger scale.

In the LED lamp of this preferred embodiment, a gap of at least 0.1 mm is preferably provided between the reflective surface and the side surface (i.e., the outer surface) of the resin portion 13. For that reason, the light ray is not reflected back from the reflective surface to the resin portion 13 so easily. As a result, the color unevenness, which might be caused due to the optical path difference in the situation shown in FIG. 2, is hardly noticeable if any.

Embodiment 3

Figure 9A:
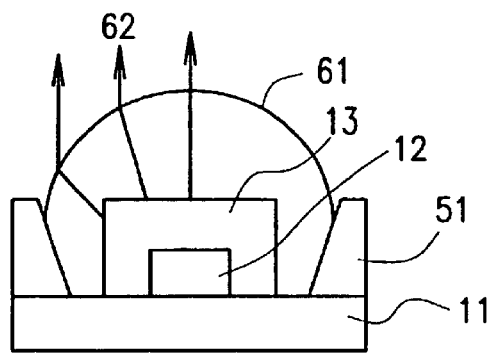
FIGS. 9A and 9B are respectively a cross-sectional view and a plan view schematically illustrating an LED lamp according to a third specific preferred embodiment of the present invention.
Figure 9B:
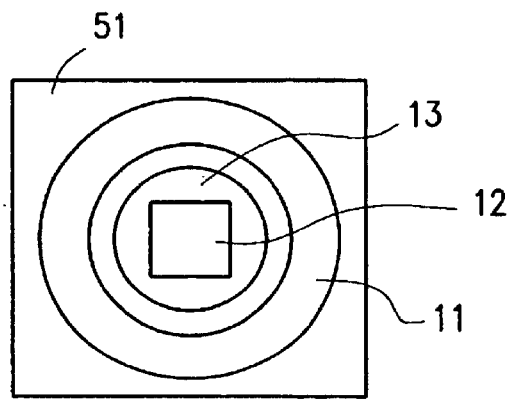

Hereinafter, an LED lamp according to a third specific preferred embodiment of the present invention will be described with reference to FIGS. 9A and 9B. FIGS. 9A and 9B are respectively a cross-sectional view and a plan view schematically illustrating the LED lamp of the third preferred embodiment.

In this preferred embodiment, a second resin portion 61 is preferably further provided over the substrate 11 so as to cover the cylindrical resin portion 13. Also, this second resin portion 61 is preferably shaped so as to function as a lens. Specifically, this second resin portion 61 preferably transforms light rays 62, which have been emitted from the LED chip 12 through upper and side surfaces thereof, into substantially parallel light rays. As a result, the optical output of the LED lamp increases as measured perpendicularly to the principal surface of the substrate.

The second resin portion 61 of this preferred embodiment is preferably made of an epoxy resin, for example, and includes no phosphor. In this preferred embodiment, the second resin portion 61 preferably covers the first resin portion 13 entirely and fills the gap between the reflective surface of the reflector 51 and the side surface of the first resin portion 13. The second resin portion 61 also performs the functions of protecting the first resin portion 13 and increasing the reliability thereof. The second resin portion 61 with these functions is in close contact with the reflective surface but includes no phosphor, thus hardly causing the color unevenness problem shown in FIG. 2.

In the preferred embodiment illustrated in FIG. 9A, the second resin portion 61 is formed in a lens shape. However, the second resin portion 61 may also have any of various other shapes as long as the second resin portion 61 can perform the desired optical functions.

FIGS. 8A and 8B or 9A and 9B illustrate only one LED chip 12. In an actual LED lamp, however, a number of LED chips are preferably arranged on the same substrate. In that case, the reflector 51 preferably has a plurality of openings that surrounds the respective LED chips. Each of those openings of the reflector 51 also preferably has a sloped side surface functioning as a reflective surface.

The reflector 51 is preferably at most twenty times as thick as the resin portion 13 including the phosphor. To reduce the thickness of the LED lamp sufficiently, the reflector 51 preferably has a thickness of 5 mm or less.

In this preferred embodiment, the shape and sizes of the reflective surface are defined so as to surround its associated LED chip. Thus, the reflector 51 can have a reduced thickness and the overall LED lamp can also have a reduced size.

Figure 25:
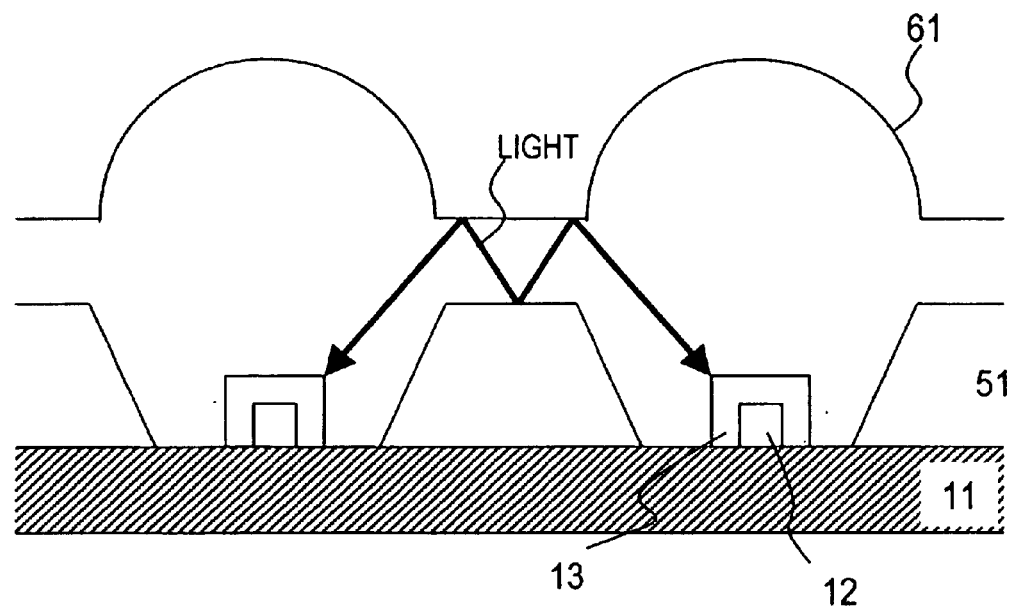
FIG. 25 is a cross-sectional view schematically illustrating a second resin portion that functions as a lens array.

It should be noted that if a number of LED chips are arranged on the same substrate, a reflector with multiple reflective surfaces surrounding the respective LED chips is preferably attached to the substrate and then a second resin portion, functioning as a lens array, is preferably provided thereon as shown in FIG. 25. This second resin portion does not have to be divided into multiple lenses for the respective LED chips but may be a single continuous member as shown in FIG. 25. In that case, the second resin portion has junction portions that link the array of lens together. Those junction portions may function as optical waveguides. Accordingly, the second resin portion can mix together the light rays that have been emitted from the respective LED chips and first resin portion, thus further reducing the color unevenness.

Figure 26:
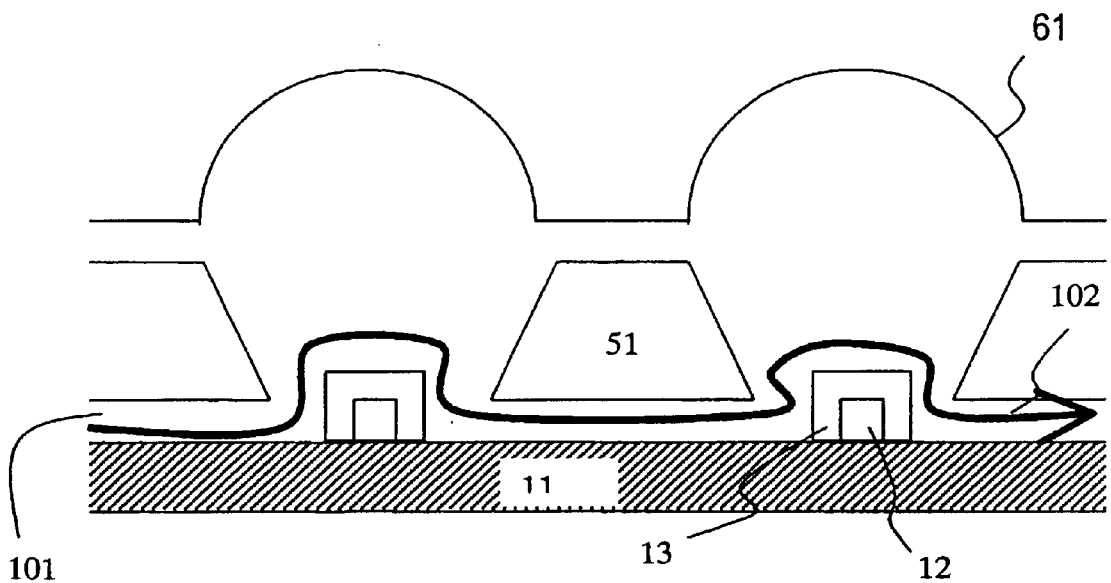
FIG. 26 is a cross-sectional view schematically illustrating the flow of a resin while the second resin portion is being formed.

The substrate 11 and reflector 51 are originally two separate members. Accordingly, a gap 101 may be intentionally provided between the substrate 11 and the reflector 51 as shown in FIG. 26. By providing such a gap 101, a portion of the second resin may flow along the path indicated by the arrow 102 in FIG. 26 into the gap 101 while the second resin portion is being formed. When such a configuration is adopted, bubbles, created in the second resin portion being formed over the reflector 51, can flow into the gap 101 along with the second resin. As a result, most of the bubbles can be removed from the parts of the second resin portion that cover the LED chips.

In the preferred embodiment described above, light can be extracted efficiently from the respective LED chips. However, if the multiple LED chips were surrounded with a single reflective surface, then a light ray emitted from one of those LED chips should be absorbed into adjacent LED chips and the emission could not be extracted efficiently enough. Also, in that case, the light ray emitted from each LED chip should go a long distance to reach the reflective surface. Thus, the reflective surface should have its height increased. This is not preferable to reduce the size of the LED lamp.

Embodiment 4

Figure 10:
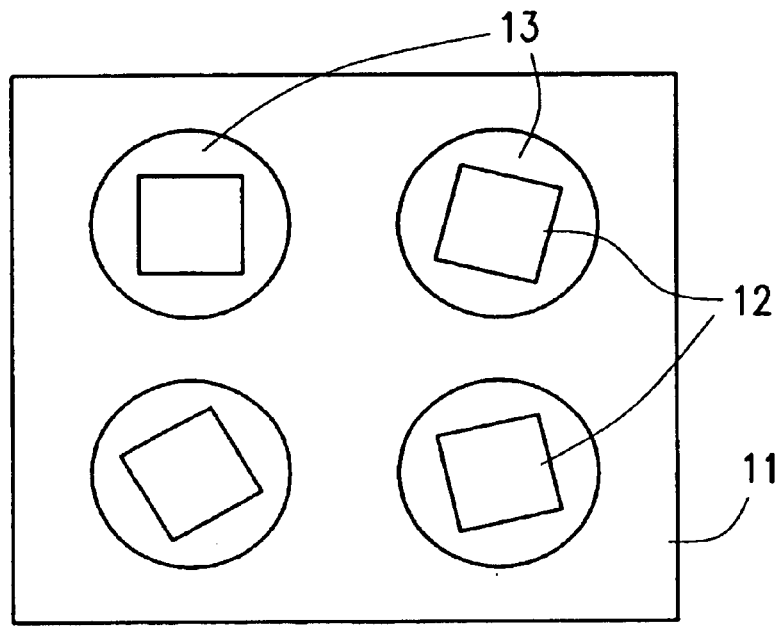
FIG. 10 is a plan view schematically illustrating an LED lamp according to a fourth specific preferred embodiment of the present invention.

Hereinafter, an LED lamp according to a fourth specific preferred embodiment of the present invention will be described with reference to FIG. 10. FIG. 10 is a plan view schematically illustrating the LED lamp of the fourth preferred embodiment.

In this preferred embodiment, a number of LED chips 12 are bonded to the same substrate 11 by the ultrasonic flip-chip bonding technique described above. Accordingly, while being mounted on the substrate 11, the LED chips 12 rotate and face various directions as shown in FIG. 10. It should be noted that the difference in the angle of rotation between the respective LED chips 12 is exaggerated and greater than the actual one.

According to this preferred embodiment, even though the respective LED chips 12 face various directions as shown in FIG. 10, the effects of the color unevenness can also be reduced because the resin portions 13 are formed in a cylindrical shape.

Embodiment 5

Figure 11:
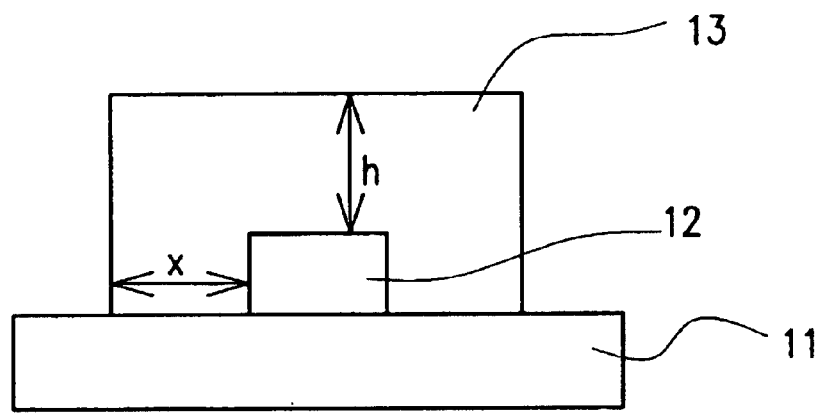
FIG. 11 is a cross-sectional view schematically illustrating an LED lamp according to a fifth specific preferred embodiment of the present invention.

Hereinafter, an LED lamp according to a fifth specific preferred embodiment of the present invention will be described with reference to FIG. 11. FIG. 11 is a cross-sectional view schematically illustrating the LED lamp of the fifth preferred embodiment.

The LED lamp of this preferred embodiment preferably satisfies $0.2 \leq h/x \leq 0.5$, where h is the distance between the upper surface of the resin portion 13 including the phosphor and that of the LED chip 12 and x is the distance between the side surface of the resin portion 13 and those of the LED chip 12.

Figure 12:
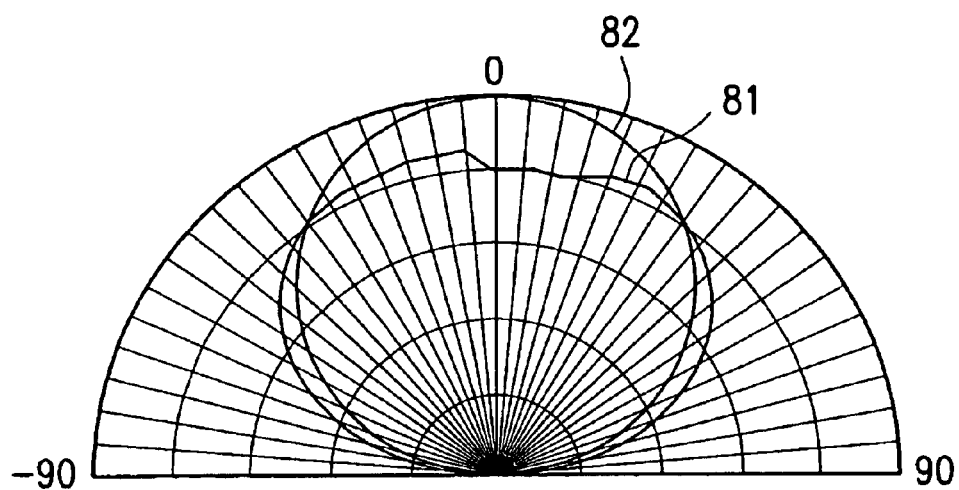
FIG. 12 is a diagram showing the spatial distribution of luminous intensity of a flip-chip-bonded blue LED chip.

FIG. 12 shows the spatial distribution of luminous intensity of a flip-chip-bonded blue LED chip. In FIG. 12, the curve 81 represents the spatial distribution of luminous intensity of the LED chip, while the curve 82 represents the spatial distribution of luminous intensity of a normal light source in accordance with the cosine emission law. As can be seen from FIG. 12, the luminous intensity of the flip-chip bonded LED chip as measured perpendicularly to the principal surface of the substrate is approximately 20% lower than that of the normal light source. This is believed to be because the quantity of the light emitted from the upper surface of the LED chip would be about 20% smaller than that of the light emitted from the side surfaces of the LED chip. Accordingly, the spatial distribution of luminous intensity cannot be improved if a part of the resin portion including the phosphor, through which the light that has been emitted from the side surfaces of the LED chip passes, is as thick as another part of the resin portion, through which the light that has been emitted from the upper surface of the LED chip passes.

Thus, to compensate for the difference between the quantity of the light emitted from the upper surface of the LED chip 12 and that of the light emitted from the side surfaces thereof, that part of the resin portion 13, located over the upper surface of the LED chip 12, is made relatively thin in this preferred embodiment. It should be noted that the first resin portion 13 is illustrated as an excessively thick one in FIG. 11 for the sake of clarity.

The present inventors discovered and confirmed via experiments that where the phosphor was included in those parts of the resin portion 13, located over the upper surface of the LED chip and around the side surfaces of the LED chip, under the same condition, the spatial distribution of luminous intensity could be improved when $0.2 \leq h/x \leq 0.5$ was satisfied. That is to say, if the resin portion 13 is shaped so as to satisfy this inequality, the resultant spatial distribution of luminous intensity will be substantially represented by the curve 82 shown in FIG. 12.

In this preferred embodiment, the resin portion 13 has a cylindrical shape, while the LED chip 12 has a rectangular parallelepiped shape. Accordingly, the thickness (i.e., the lateral size) of the resin portion 13 that covers the side surfaces of the LED chip 12 changes according to the direction. Thus, the "distance x between the side surface of the resin portion 13 and the side surfaces of the LED chip 12" means herein "the distance from the center of each side surface of the LED chip 12 to the intersection between the side surface of the resin portion 13 and a line extending from that center perpendicularly to the side surface of the resin portion 13".

Embodiment 6

Figure 13:
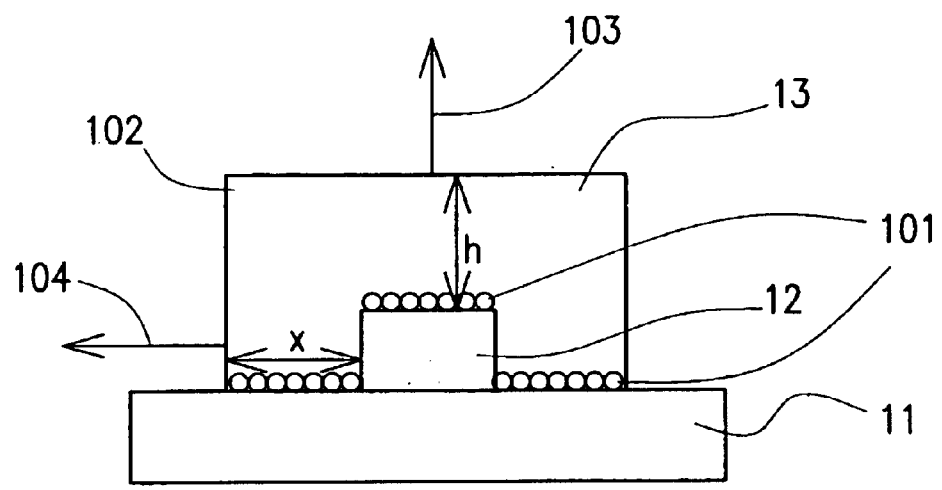
FIG. 13 is a cross-sectional view schematically illustrating an LED lamp according to a sixth specific preferred embodiment of the present invention.

Hereinafter, an LED lamp according to a sixth specific preferred embodiment of the present invention will be described with reference to FIG. 13. FIG. 13 is a cross-sectional view schematically illustrating the LED lamp of the sixth preferred embodiment.

If the phosphor is distributed non-uniformly in the cylindrical resin portion 13 (i.e., if the phosphor over the upper surface of the LED chip 12 is distributed differently from that around the side surfaces of the LED chip 12), then the resultant spatial distribution of luminous intensity might deteriorate due to the non-uniform distribution of the phosphor. In view of this potential problem, this preferred embodiment provides a means for minimizing such deterioration.

The resin portion 13 including the phosphor is preferably made of an epoxy resin or a silicone resin. While setting thermally, each of these resins has an extremely decreased viscosity albeit temporarily. Accordingly, if the phosphor has a mean particle size of 3 $\mu$m to 15 $\mu$m and has a greater specific gravity than the resin, then the phosphor will cause a sedimentation phenomenon while the resin is setting thermally. FIG. 13 schematically illustrates a state in which such a phenomenon has occurred. In the exaggerated example shown in FIG. 13, a sediment phosphor layer 101 is formed on the bottom of the resin layer 102. However, the phosphor is normally not separated from the resin as completely as shown in FIG. 13. Also, by adding a thixo agent, the sedimentation of the phosphor during the thermal setting of the resin can be reduced to a certain degree.

Generally speaking, while setting thermally, the silicone resin does not decrease its viscosity as extremely as the epoxy resin, is softer than the epoxy resin, and can relax the stress better than the epoxy resin. Accordingly, the silicone resin is preferred to the epoxy resin as a material for the resin portion 13. Thus, the present inventors defined the conditions for matching the color of the light 103 emitted from the upper surface of the resin portion 13 with that of the light 104 emitted from the side surface of the resin portion 13 where the resin portion 13 was made of a silicone resin.

In this preferred embodiment, the distance between the upper surface of the resin portion 13 including the phosphor and that of the LED chip 12 is also identified by h and the distance between the side surface of the resin portion 13 and those of the LED chip 12 is also identified by x. The LED chip 12 was 0.3 mm square and had a thickness of 0.09 mm. The distance h was set to 0.02 mm or 0.1 mm. When the distance h was 0.02 mm, the distance x was selected from the six values of 0.1 mm, 0.15 mm, 0.2 mm, 0.25 mm, 0.3 mm and 0.35 mm. On the other hand, when the distance h was 0.1 mm, the distance x was selected from the five values of 0.1 mm, 0.2 mm, 0.3 mm, 0.4 mm and 0.55 mm. The phosphor exhibited a broad spectral distribution with a peak wavelength of 575 nm. The phosphor and the silicone resin were mixed together at a weight ratio of approximately 70 to 30. The mixing and defoaming processes were carried out sufficiently with a machine.

With a current of about 40 mA supplied to the LED chip 12, the spectral irradiance of the light emitted from the upper surface of the resin portion 13 and that of the light emitted from the side surface thereof were measured. The chromaticities of the illuminations were obtained based on the results of this measurement. And the difference $\Delta Cu'v'$ in chromaticity between the light emitted from the upper surface and the light emitted from the side surface was calculated.

Figure 14:
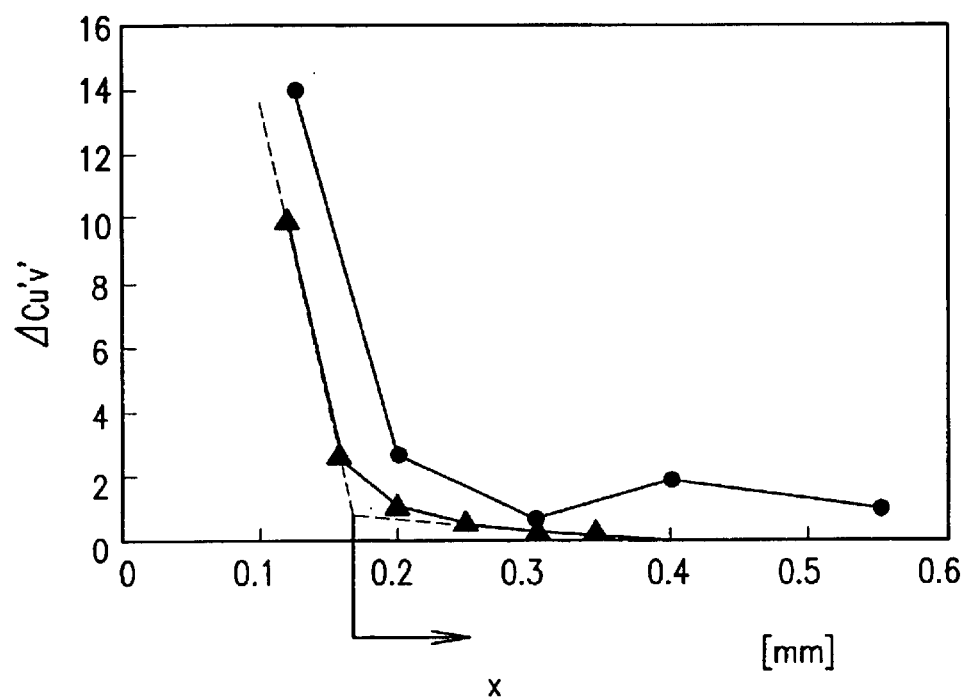
FIG. 14 is a graph showing how the chromaticity difference changes with x in the sixth preferred embodiment.

FIG. 14 is a graph showing how the chromaticity difference $\Delta Cu'v'$ changed with x. In FIG. 14, the curve plotted with ▲ represents the data obtained when h was 0.02 mm while the curve plotted with ● represents the data obtained when h was 0.1 mm.

As can be seen from the results shown in FIG. 14, when h was 0.02 mm, the inflection point, at which the chromaticity difference started to decrease, was located where x=0.15 mm. On the other hand, when h was 0.1 mm, the inflection point, at which the chromaticity difference started to decrease, was located where x=0.2 mm. Thus, it can be seen that if the distance h between the upper surface of the LED chip 12 and that of the resin portion 13 is in the range of 0.02 mm to 0.1 mm, the color unevenness can be reduced by defining the distance x between the side surfaces of the LED chip 12 and the side surface of the cylindrical resin portion 13 within the range of 0.15 mm to 0.5 mm.

These data were obtained when h was 0.02 mm and when h was 0.1 mm. By reducing the weight ratio or the concentration of the phosphor included in the resin portion, the resin portion can be thickened. If the phosphor has a high weight ratio, then even a thin resin portion can absorb a good portion of the light emitted from the LED chip and can transform it into light with a longer wavelength. The properties of a relatively thick resin portion (in which h was greater than 0.1 mm) obtained by adding a non-YAG-based phosphor to a silicone resin were evaluated.

Hereinafter, the results of the evaluation will be described in detail with reference to the accompanying drawings.

The phosphor and the silicone resin were mixed together at a weight ratio of approximately 70 to 30. The LED chip used had a substantially rectangular parallelepiped shape with a height of 0.1 mm and an approximately square cross section of 0.32 mm×0.30 mm. Two types of LED chips with a peak wavelength of 458 nm and a peak wavelength of 464 nm were used.

Figure 20:
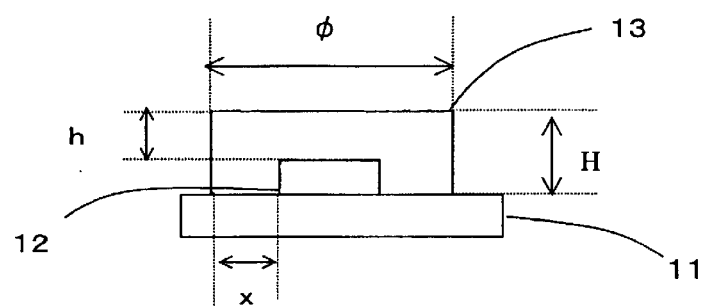
FIG. 20 shows various dimensional parameters for an LED lamp according to a preferred embodiment of the present invention.

FIG. 20 shows various dimensional parameters for a cylindrical resin portion that was formed so as to cover a single LED chip. In the example shown in FIG. 20, the diameter and the height of the resin portion are identified by $\phi$ and H, respectively.

Figure 21A:
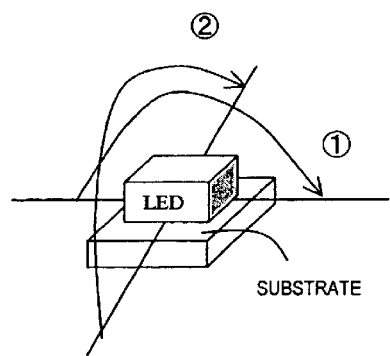
FIGS. 21A and 21B show how to measure the spatial distribution of luminous intensity of an LED lamp.
Figure 21B:
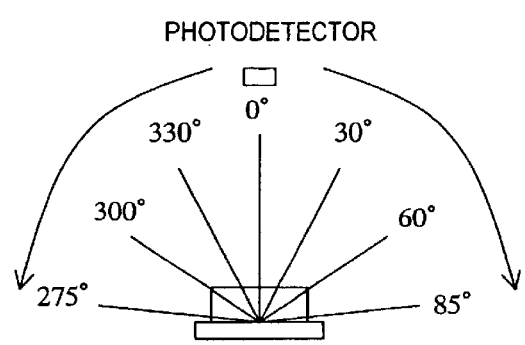

The spectral and spatial distribution was measured as shown in FIG. 21A and 21B. More specifically, the angular dependences of two emission spectra were obtained with respect to two planes that were defined perpendicularly to the principal surface of the substrate as shown in FIG. 21A The measurement was carried out with a spectrophotometer MCPD 1000 produced by Otsuka Electronics Co., Ltd. and with a current of about 40 mA supplied to the LED chip for emission purposes.

Figure 22A:
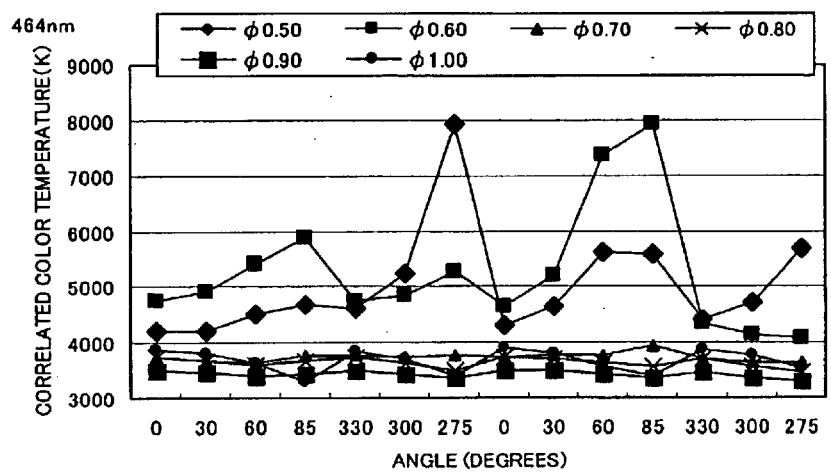
FIG. 22A is a graph showing the spatial distribution of a correlated color temperature for a light ray with a peak wavelength of 464 nm in an LED lamp according to a preferred embodiment of the present invention.
Figure 22B:
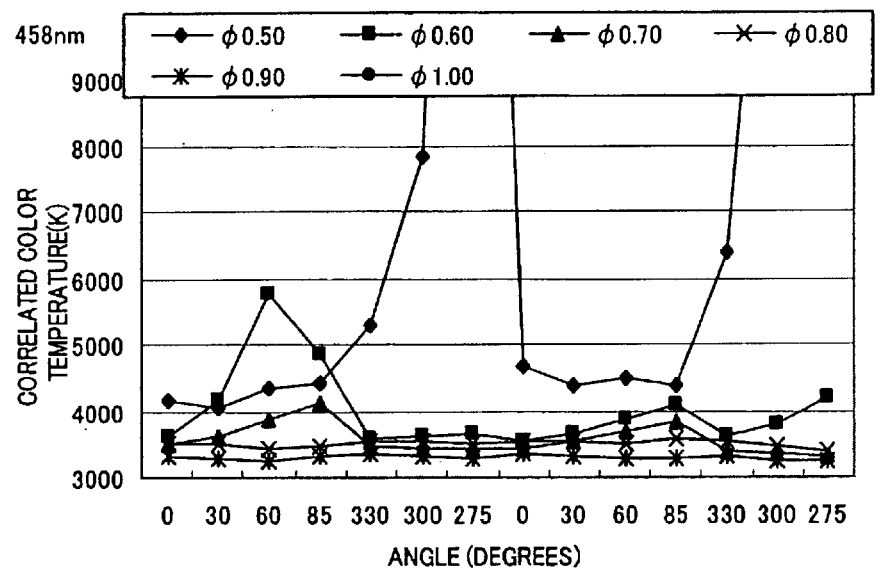
FIG. 22B is a graph showing the spatial distribution of a correlated color temperature for a light ray with a peak wavelength of 458 nm in the LED lamp of the preferred embodiment of the present invention.

FIG. 22A shows the data obtained about the light with a peak wavelength of 464 nm, i.e., the angular dependences for resin portions with diameters $\phi$ of 0.5 mm, 0.6 mm, 0.7 mm, 0.8 mm, 0.9 mm and 1.0 mm and a height H of about 0.34 mm. FIG. 22B shows the data obtained about the light with a peak wavelength of 458 nm in a similar manner. In FIGS. 22A and 22B, the ordinate represents the correlated color temperature, while the abscissa represents the angle that is defined by a line connecting the center of the LED chip to that of the light receiving area of a photodetector with respect to a normal to the principal surface of the substrate as shown in FIG. 21 B.

As can be seen from FIGS. 22A and 22B, if the resin portion had a diameter $\phi$ of 0.7 mm or more, the correlated color temperature exhibited little angular dependence, thus resulting in small color unevenness.

Figure 23:
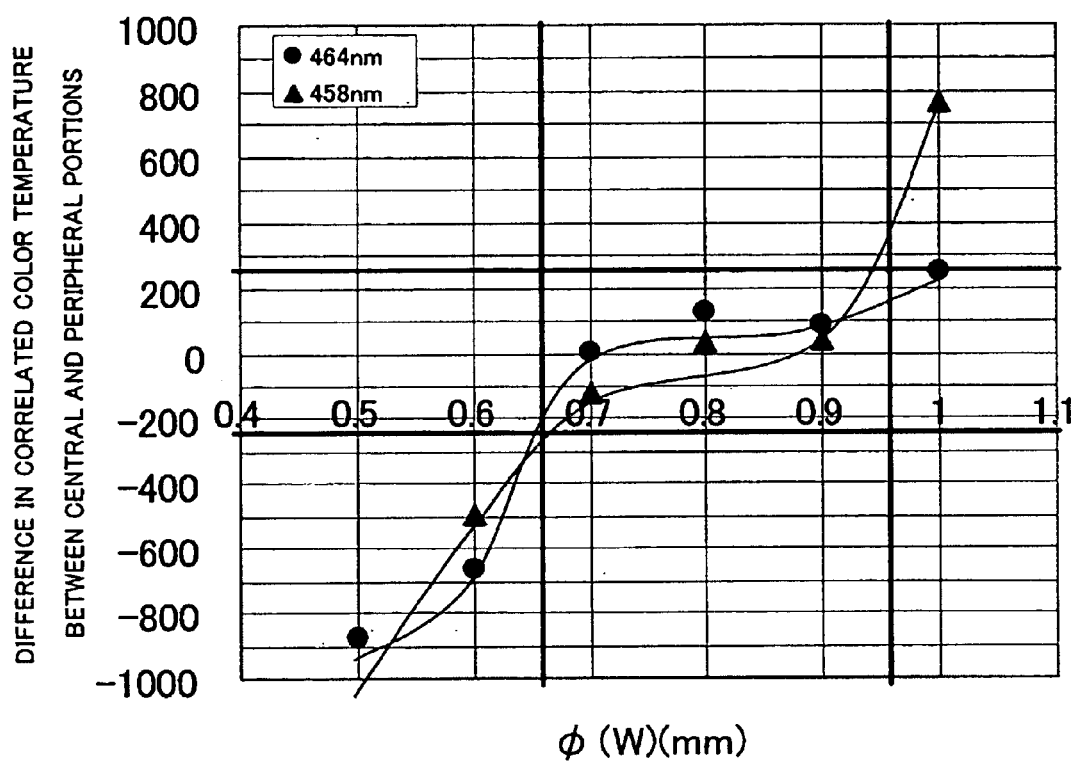
FIG. 23 is a graph showing the difference in correlated color temperature between the central and peripheral portions of an LED lamp according to a preferred embodiment of the present invention.

The data shown in FIGS. 22A and 22B were obtained by measuring the quantities of the emission of the LED chip in fourteen different directions. Next, based on these data collected, the difference between the data obtained at a zero degree (i.e., perpendicularly to the substrate) and the data obtained at a non-zero degree (i.e., with a tilt angle defined with respect to a normal to the substrate) was obtained. The former data will be referred to herein as "central data", while the latter data will be referred to herein as "peripheral data". FIG. 23 is a graph showing how the difference between the central and peripheral data (plotted as the ordinate) changes with the diameter φ of the resin portion (plotted as the abscissa). In FIG. 23, the curve plotted with ● represents the data about the light with a wavelength of 464 nm, while the curve plotted with ▲ represents the data about the light with a wavelength of 458 nm.

As can be seen from FIG. 23, the difference between the correlated color temperatures (i.e., the difference between the central and peripheral data) tended to increase not only when the resin portion had a diameter of 0.6 mm or less but also when the resin portion had a diameter of 1.0 mm. Thus, it can be understood that the performance of the LED lamp also deteriorates if the resin portion has an excessive diameter φ.

The present inventors discovered and confirmed via experiments that if the cylindrical resin portion had a height H of 0.25 mm to 0.40 mm and a diameter φ of 0.65 mm to 0.95 mm, then the color unevenness could be minimized.

These preferred values are changeable if the sizes of the LED chip are different from those of the LED chip that was used in the experiments. Thus, the preferred range may also be defined by more important parameters h and x shown in FIG. 11. In that case, the h/x ratio was preferably in the range of 0.47 to 1.82, more preferably 0.60 to 1.68, even more preferably 0.76 to 1.46, and most preferably 0.9 to 1.26.

As shown in FIG. 19, even if the LED chip has rotated, the side surfaces of the LED chip should be fully covered with the resin portion. In view of this consideration, x is preferably at least equal to about 0.02 mm. Once x is determined, h needs to be defined such that the h/x ratio falls within one of the preferred ranges described above.

If an LED chip with a square upper surface is fully covered with a cylindrical resin portion having a diameter φ, then the diameter φ needs to be longer than the diagonals of the square. When the diameter φ is equal to the diagonals, x is equal to $(\phi-\phi/2^{1/2})/2$. Accordingly, the inequality $x>(\phi-\phi/2^{1/2})/2$ is preferably satisfied.

Embodiment 7

Figure 15:
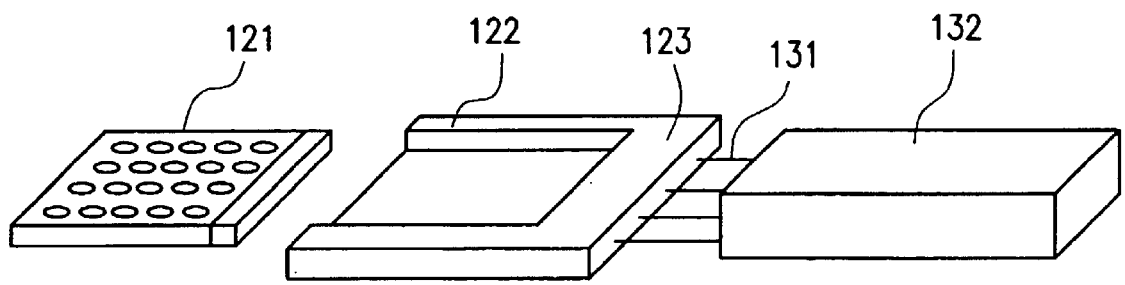
FIG. 15 is a perspective view schematically illustrating an LED lamp according to a seventh specific preferred embodiment of the present invention.

Hereinafter, an LED lamp according to a seventh specific preferred embodiment of the present invention will be described with reference to FIG. 15. FIG. 15 is a perspective view illustrating a card LED lamp 121 according to this preferred embodiment, a connector 123 to/from which the LED lamp 121 is attachable and removable, and a lighting circuit 132 to be electrically connected to the LED lamp 121 by way of the connector 123.

As shown in FIG. 15, the card LED lamp 121 is preferably inserted into the connector 123 through a pair of guide grooves 122. The guide grooves 122 are provided to slide the edges of the substrate of the LED lamp 121 in a predetermined direction while the LED lamp 121 is being inserted into, or removed from, the connector 123. The connector 123 includes a feeder electrode (not shown) to be electrically connected to the feeder electrode (not shown) of the card LED lamp 121, and is connected to the lighting circuit 132 via lines 131.

The LED lamp 121 includes a plurality of LED chips, which are preferably bonded to a rectangular substrate. Each of those LED chips is preferably covered with the cylindrical resin portion. Optionally, the substrate of the LED lamp 121 may have a multilevel interconnect structure for connecting the respective LED chips to the feeder electrode. Also, a metallic reflector with multiple openings for the respective LED chips may be attached to the surface of the substrate.

In this manner, the LED lamp 121 of this preferred embodiment has a card shape, which is similar to a memory card, for example, and can be attached into, or removed from, any of various types of appliances with a connector. Accordingly, even when the LED lamp 121 that has been used in an illumination unit runs out of its life, the illumination unit can be used continuously by replacing the exhausted LED lamp 121 with a brand-new LED lamp of the same shape. Also, if multiple types of LED lamps 121 with mutually different properties are appropriately selected and fitted in an illumination unit one after another, various types of illumination can be provided with the same illumination unit.

Figure 16:
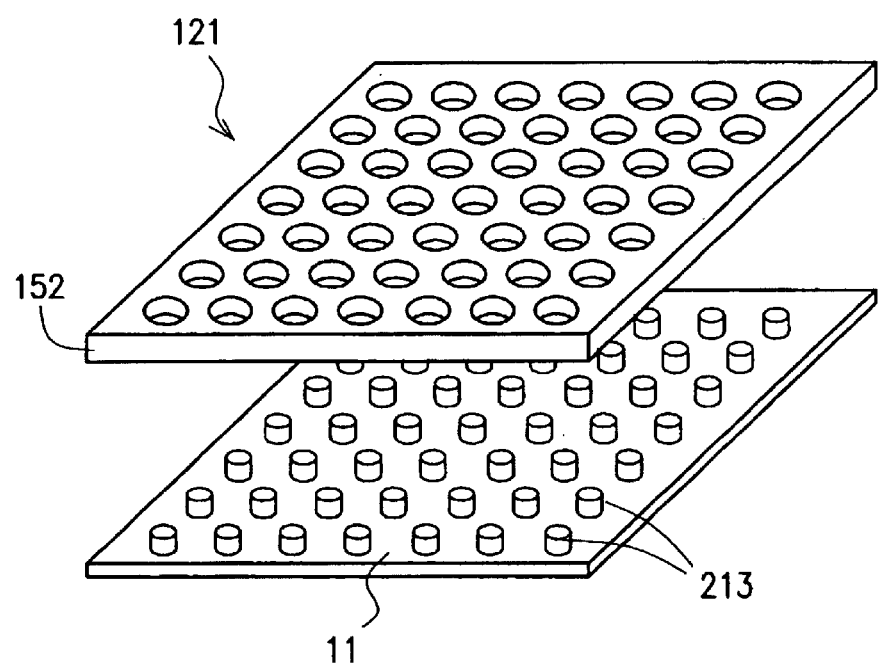
FIG. 16 is an exploded perspective view of a card LED lamp.
Figure 17:
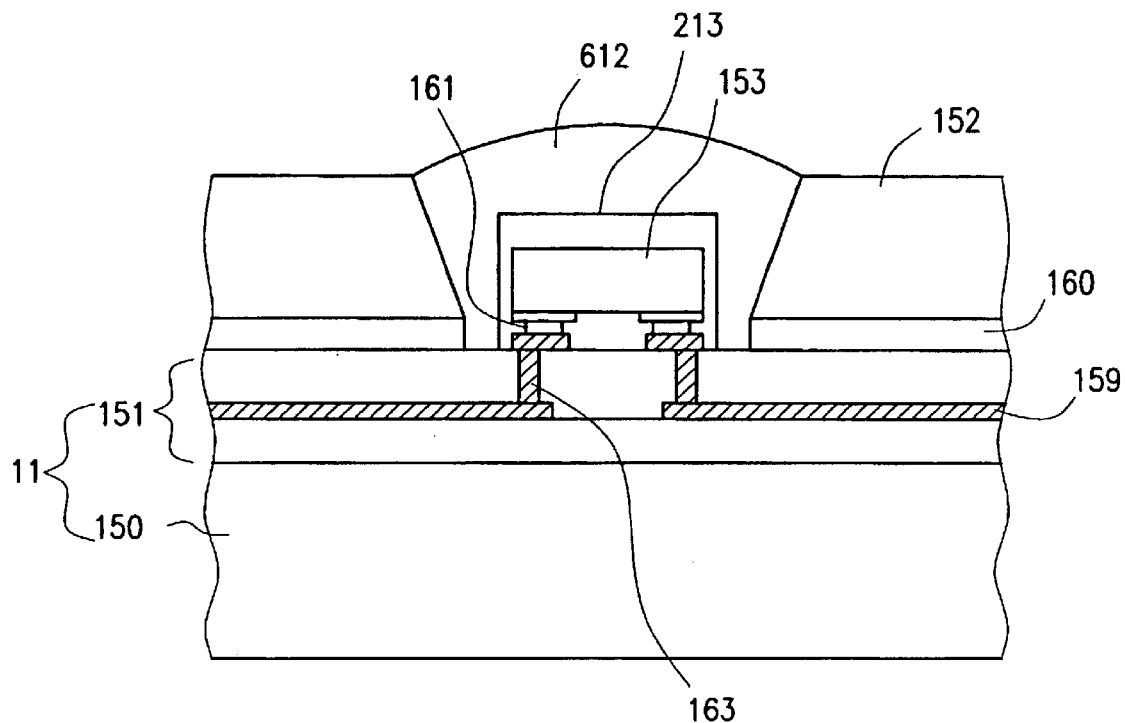
FIG. 17 is a cross-sectional view illustrating a portion of the card LED lamp shown in FIG. 16 including an LED chip.

Next, the configuration of the card LED lamp 121 of this preferred embodiment will be described in further detail with reference to FIGS. 16 and 17. FIG. 16 is an exploded perspective view of the card LED lamp 121. FIG. 17 is a cross-sectional view illustrating a portion of the card LED lamp 121 including an LED chip.

Referring to FIG. 16, the LED lamp 121 of this preferred embodiment preferably includes a plurality of cylindrical resin portions 213, which are arranged in matrix on a substrate 11. Although not shown in FIG. 16, each of the resin portions 213 includes an LED chip that has been molded with the resin. As described above, a phosphor is preferably dispersed in the cylindrical resin portion 213 to transform the emission of the LED chip into light with a longer wavelength.

A reflector 152 with multiple openings surrounding the respective cylindrical resin portions 213 is preferably attached to the surface (i.e., the mount-side surface) of the substrate 11. The inside surface of each opening of the reflector 152 is downwardly tapered so as to function as a reflective surface for reflecting the emission of the cylindrical resin portion 213.

Next, referring to FIG. 17, each LED chip 153 of this preferred embodiment is preferably flip-chip bonded to an interconnect pattern 159 of a multilayer wiring board 151, which is attached to a metal plate 150. In this case, the metal plate 150 and the multilayer wiring board 151 together make up the substrate 11. The LED chip 153 is covered with the cylindrical resin portion 213 including the phosphor. And this resin portion (i.e., first resin portion) 213 is further covered with a second resin portion 162 functioning as a lens.

In this preferred embodiment, the multilayer wiring board 151 includes a two-layered interconnect pattern 159, in which interconnects belonging to the two different layers are connected together by way of via metals 163. Specifically, the interconnects belonging to the upper layer are connected to the electrodes of the LED chip 153 via Au bumps 161. The interconnect pattern 159 may be made of copper, nickel, aluminum, or an alloy mainly composed of these metals, for example.

The upper surface of the multilayer wiring board 151 having such a configuration is mostly covered with the reflector 152 but is partially exposed. A number of feeder electrodes (not shown) are provided on the exposed areas of the multilayer wiring board 151. These feeder electrodes are electrically connected to the lighting circuit of an illumination unit by way of the connector into which the card LED lamp is inserted.

In the example illustrated in FIG. 17, an underfill (stress relaxing) layer 160 is preferably provided between the reflector 152 and the multilayer wiring board 151. This underfill layer 160 can not only relax the stress, resulting from the difference in thermal expansion coefficient between the metallic reflector 152 and the multilayer wiring board 151, but also ensure electrical insulation between the reflector 152 and the upper-level interconnects of the multilayer wiring board 151.

Embodiment 8

Figure 18A:
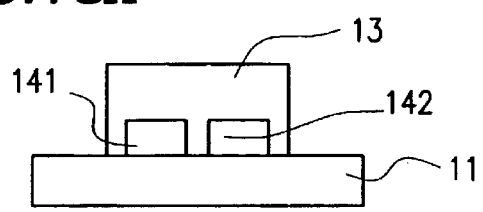
FIGS. 18A and 18B are respectively a cross-sectional view and a plan view schematically illustrating an LED lamp according to an eighth specific preferred embodiment of the present invention.
Figure 18B:
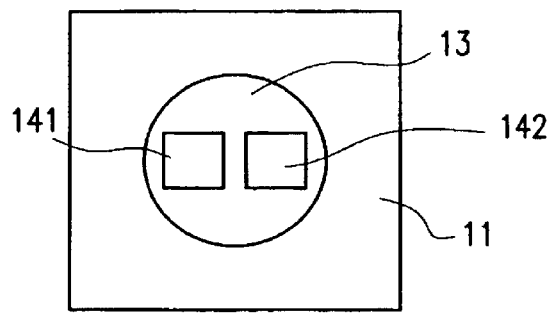

Hereinafter, an LED lamp according to an eighth specific preferred embodiment of the present invention will be described with reference to FIGS. 18A and 18B. FIGS. 18A and 18B are respectively a cross-sectional view and a plan view schematically illustrating an LED lamp according to the eighth preferred embodiment.

In this preferred embodiment, two LED chips 141 and 142 are bonded to the same substrate 11 and are covered with the same cylindrical resin portion 13 including the phosphor.

A portion of the light that has been emitted from each of these LED chips 141 and 142 is transformed by the cylindrical resin portion 13 into light having a longer wavelength. In this manner, even if multiple LED chips are covered with a single cylindrical resin portion, the color unevenness can also be reduced.

It should be noted that the wavelength of the light emitted from the LED chip 141 does not have to be equal to that of the light emitted from the LED chip 142.

The present invention is effectively applicable for use in various types of illumination sources that can replace the conventional illumination sources utilizing electric discharge.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. An LED lamp comprising:

a substrate;

an LED chip, which is flip-chip bonded to the substrate; and a resin portion, which covers the LED chip and which includes at least one type of phosphor that transforms the emission of the LED chip into light having a longer wavelength than the emission, wherein the resin portion has at least one side surface, which is separated from another surface that is able to reflect the outgoing light of the resin portion, which surrounds the side surfaces of the LED chip and at least part of which is curved.

2. The LED lamp of claim 1, wherein the LED chip has at least three planar side surfaces, each adjacent pair of which is joined together by a corner portion.

3. The LED lamp of claim 2, wherein at least part of the side surface of the resin portion, which faces the corner portion of the LED chip, is curved.

4. The LED lamp of claim 3, wherein an angle defined by the curved part of the resin portion with respect to the center of the resin portion is greater than the largest possible angle of rotation of the LED chip being mounted onto the substrate, the angle of rotation being defined with respect to the center of the LED chip.

5. The LED lamp of claim 1, wherein the resin portion has an axisymmetric shape.

6. The LED lamp of claim 5, wherein the resin portion has the shape of a cylinder, of which the diameter is longer than the diagonals of the LED chip.

7. The LED lamp of claim 6, wherein the LED lamp is designed so as to satisfy $0.02\ mm \leq h \leq 0.1\ mm$ and $0.15\ mm \leq x \leq 0.5\ mm$, where h is the distance between the upper surface of the resin portion including the phosphor and that of the LED chip and x is the distance between the side surface of the resin portion including the phosphor and those of the LED chip.

8. The LED lamp of claim 6, wherein the phosphor is a non-YAG-based substance, and wherein if h exceeds 0.1 mm, then the LED lamp satisfies $0.47 \leq h/x \leq 1.82$, where h is the distance between the upper surface of the resin portion including the phosphor and that of the LED chip and x is the distance between the side surface of the resin portion including the phosphor and those of the LED chip.

9. The LED lamp of claim 6, wherein the resin portion including the phosphor is made of a silicone resin, and wherein the phosphor has a mean particle size of 3 $\mu$m to 15 $\mu$m and has a greater specific gravity than the silicone resin, and wherein the LED lamp satisfies $0.2 \leq h/x \leq 0.5$, where h is the distance between the upper surface of the resin portion including the phosphor and that of the LED chip and x is the distance between the side surface of the resin portion including the phosphor and those of the LED chip.

10. The LED lamp of claim 9, wherein the resin portion including the phosphor includes particles of a thixo agent, of which the mean particle size is less than 1 $\mu$m.

11. The LED lamp of one of claims 1 to 10, wherein not only the LED chip but also at least one more LED chip are bonded to the substrate, and wherein each of the LED chips is covered with the resin portion separately.

12. The LED lamp of claim 11, further comprising a reflective member with reflective surfaces that are sloped so as to reflect the outgoing light of the resin portions of the LED chips away from the substrate, and wherein the reflective surfaces are sloped so as to surround the respective LED chips.

13. The LED lamp of claim 12, wherein the reflective member is a plate having multiple openings, each of which surrounds an associated one of the LED chips, and is provided on the substrate, and wherein the reflective member is at most twenty times as thick as the resin portion.

14. The LED lamp of claim 13, wherein the reflective member has a thickness of at most 5 mm.

15. The LED lamp of one of claims 1 to 10, wherein not only the LED chip but also at least one more LED chip are bonded to the substrate, and wherein all of the LED chips are covered with the single resin portion.

16. The LED lamp of one of claims 1 to 10, further comprising a reflective member with a reflective surface that is sloped so as to reflect the outgoing light of the resin portion away from the substrate.

17. The LED lamp of claim 16, wherein the reflective member is a plate provided on the substrate, and wherein the reflective surface is defined by the inner wall of an opening of the plate so as to surround the side surface of the resin portion including the phosphor.

18. The LED lamp of one of claims 1 to 10, further comprising a second resin portion that covers the resin portion(s).

19. The LED lamp of claim 16, further comprising a second resin portion that fills a gap between the side surface of the resin portion including the phosphor and the reflective member.

20. The LED lamp of claim 18 or 19, wherein the second resin portion functions as a lens.

21. The LED lamp of claim 1, wherein the center axis of the resin portion including the phosphor substantially corresponds with that of the LED chip.

22. A method for fabricating an LED lamp, the method comprising the steps of
   (a) preparing a substrate on which at least one LED chip has been flip-chip bonded, and
   (b) providing a resin portion on the substrate, the resin portion covering the LED chip and including a phosphor that transforms the emission of the LED chip into light having a longer wavelength than the emission,
   wherein the step (b) includes the step of molding a resin material such that the resin portion has an exposed side surface.

23. The method of claim 22, wherein the step (a) includes the step of preparing a substrate on which multiple LED chips have been flip-chip bonded, and
   wherein the step (b) includes the step of covering each of the LED chips with the resin portion separately.

24. The method of claim 23, wherein the step (b) includes the step of forming the resin portion in a cylindrical shape.

25. The method of claim 23 or 24, further comprising the step (c) of arranging a reflective member, having a reflective surface for reflecting the outgoing light of the resin portion, on the substrate after the step (b) has been performed.

26. The method of claim 25, wherein the step (a) includes the step of preparing a substrate on which multiple LED chips have been flip-chip bonded, and
   wherein the step (c) includes the step of arranging a reflective member, having a plurality of reflective surfaces surrounding the LED chips, on the substrate.

27. The method of claim 26, further comprising the step (d) of stacking a second resin portion on the resin portion including the phosphor after the step (c) has been performed.

28. The method of claim 27, wherein the step (d) includes the step of forming the second resin portion in a lens shape.

* * * * *

UNITED STATES PATENT AND TRADEMARK OFFICE
CERTIFICATE OF CORRECTION

PATENT NO. : 6,963,166 B2
DATED : November 8, 2005
INVENTOR(S) : Tadashi Yano et al.

It is certified that error appears in the above-identified patent and that said Letters Patent is hereby corrected as shown below:

<u>Column 20,</u>
Lines 33, 52, 56 and 65, "one of claims 1 to 10" should read -- claim 1 --;

<u>Column 21,</u>
Line 5, "or 19" should be deleted;

<u>Column 22,</u>
Line 6, "or 24" should be deleted.

Signed and Sealed this

Eleventh Day of April, 2006

JON W. DUDAS
*Director of the United States Patent and Trademark Office*